United States Patent
Sunagawa et al.

(10) Patent No.: US 7,068,414 B2
(45) Date of Patent: Jun. 27, 2006

(54) EXPOSURE HEAD AND EXPOSURE APPARATUS

(75) Inventors: Hiroshi Sunagawa, Kanagawa (JP); Hiromi Ishikawa, Kanagawa (JP); Yoji Okazaki, Kanagawa (JP); Kazuhiko Nagano, Kanagawa (JP); Takeshi Fujii, Kanagawa (JP); Toshihiko Omori, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/456,968

(22) Filed: Jun. 9, 2003

(65) Prior Publication Data

US 2004/0027681 A1 Feb. 12, 2004

(30) Foreign Application Priority Data

Jun. 7, 2002 (JP) .............................. 2002-167403
Jun. 7, 2002 (JP) .............................. 2002-167404

(51) Int. Cl.
*G02B 26/00* (2006.01)
(52) U.S. Cl. ................................... 359/290
(58) Field of Classification Search ................ 359/290, 359/291, 237, 238, 310, 316, 618, 621, 622, 359/623

See application file for complete search history.

(56) References Cited

U.S. PATENT DOCUMENTS

| | | | | |
|---|---|---|---|---|
| 5,666,226 A | * | 9/1997 | Ezra et al. | 359/621 |
| 5,889,567 A | * | 3/1999 | Swanson et al. | 349/62 |
| 6,469,830 B1 | * | 10/2002 | Dubin et al. | 359/449 |
| 6,480,324 B1 | * | 11/2002 | Quate et al. | 359/298 |

* cited by examiner

*Primary Examiner*—Ricky Mack
*Assistant Examiner*—Tuyen Tra
(74) *Attorney, Agent, or Firm*—Sughrue Mion, PLLC

(57) ABSTRACT

A reduction in utilization efficiency of laser beams emitted from laser emission portions of illumination means is limited and an exposure surface is exposed by beam spots with desired spot diameters and spot forms. At an exposure head, first microlenses are arranged in a two dimensional manner so as to correspond to micromirrors at a DMD, and apertures are arranged in a two dimensional manner at back side focusing positions of the first microlenses. With this exposure head, light source images, which are formed to be very small at back side focusing positions of the first microlenses by the first microlenses, are projected onto the exposure surface, and these light source images serve as beam spots BS and expose the exposure surface.

22 Claims, 28 Drawing Sheets

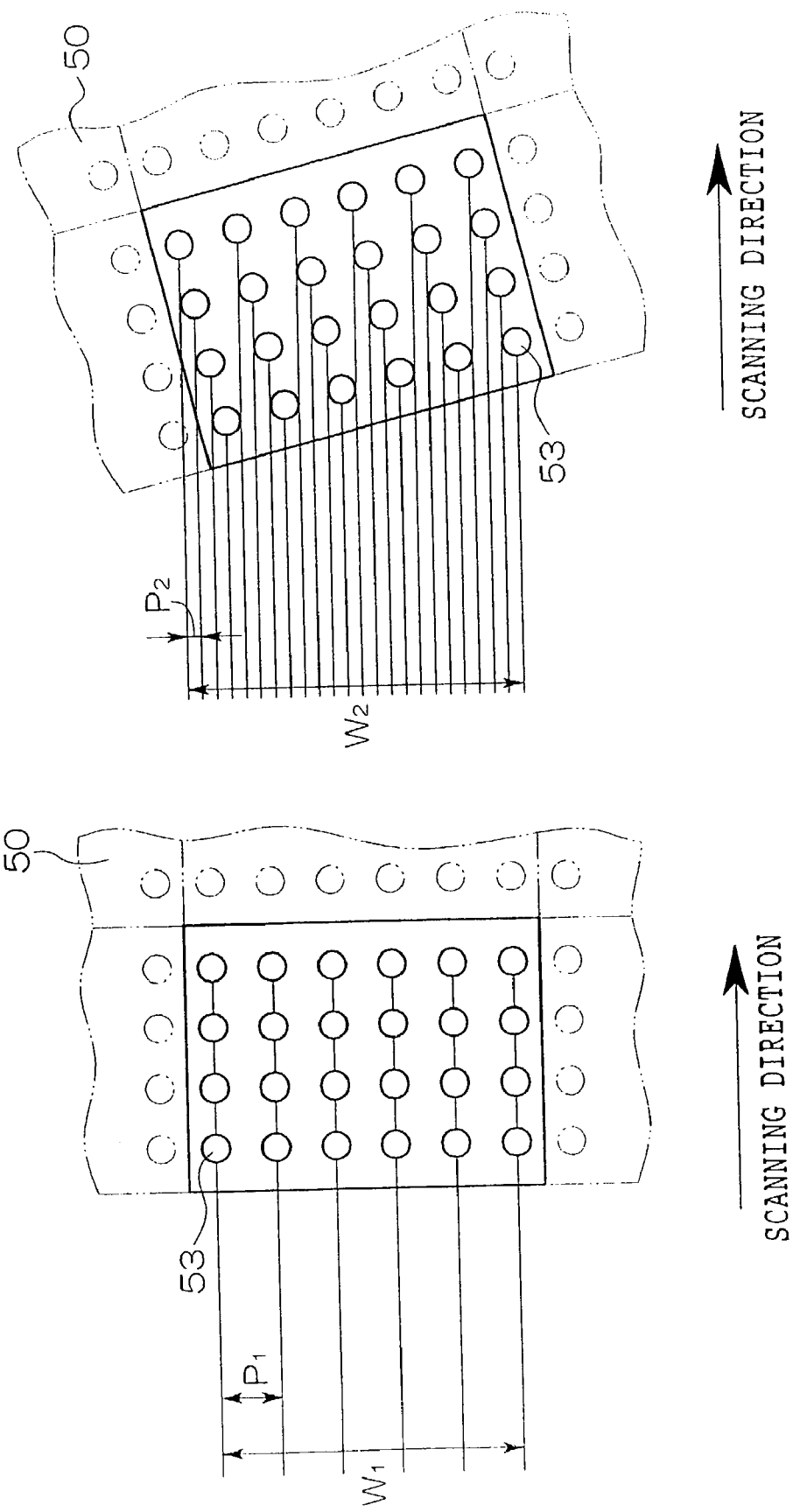

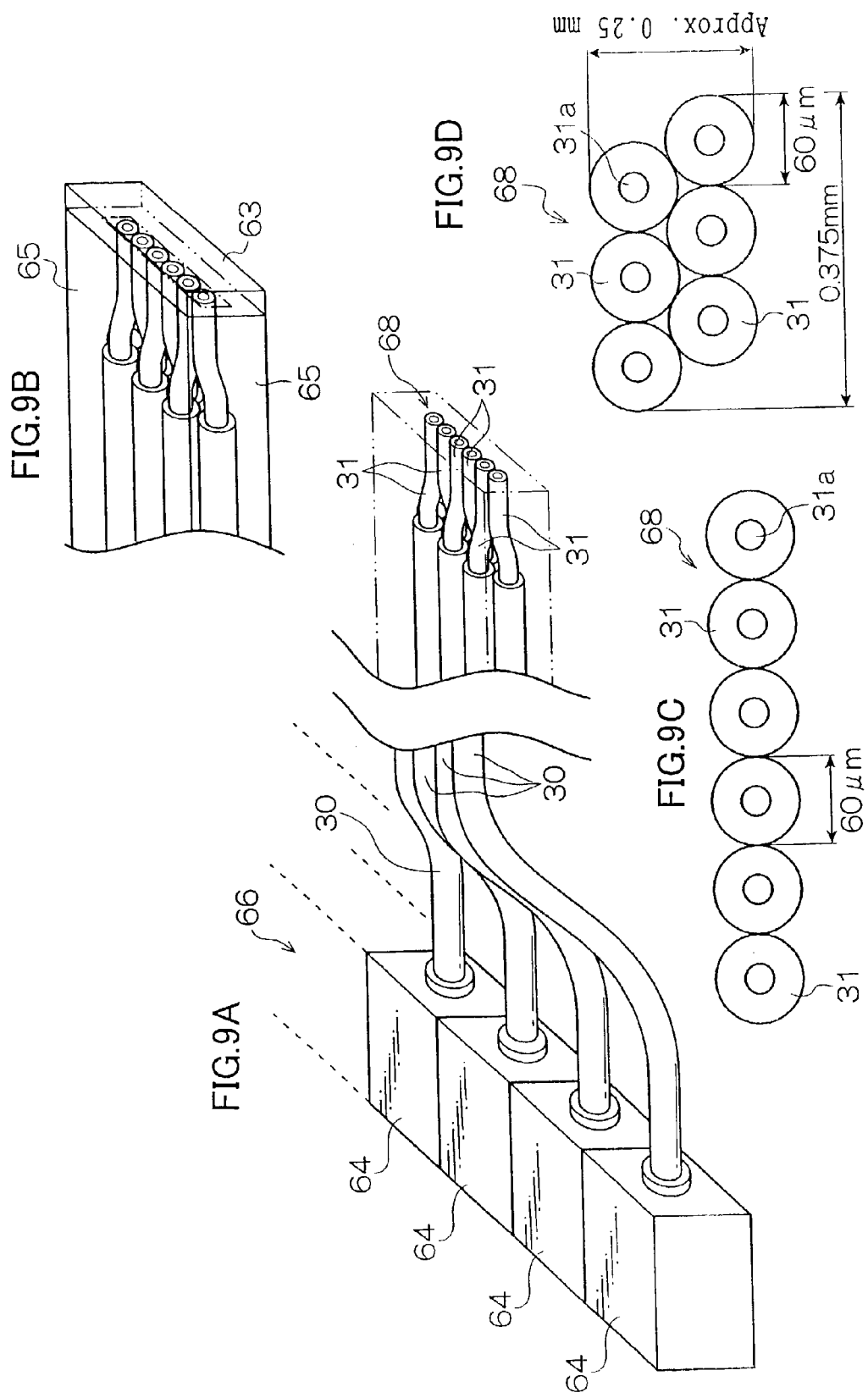

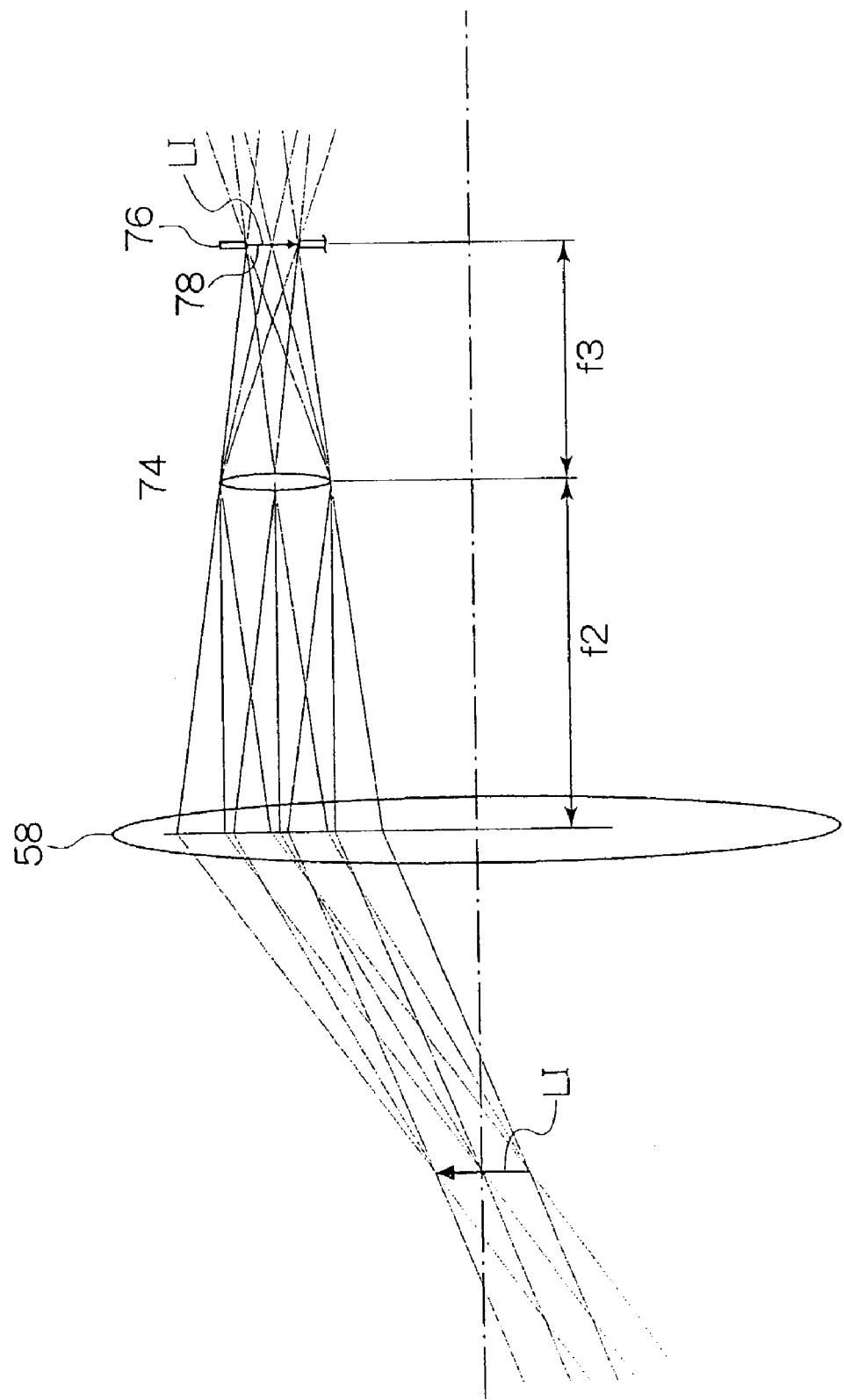

EXPOSURE HEAD AND EXPOSURE APPARATUS

BACKGROUND OF THE INVENTION

1. Field of the Invention

The present invention relates to an exposure head for exposing an exposure surface at a recording medium or the like with a laser beam which is spatially modulated by a spatial modulation element in accordance with image data, and to an exposure apparatus equipped with this exposure head.

2. Description of the Related Art

Heretofore, various exposure apparatuses which employ spatial light modulation elements such as digital micromirror devices (DMD) and the like have been proposed for carrying out image exposure with light beams modulated in accordance with image data.

An example of a DMD is a mirror device in which numerous micromirrors, which alter angles of reflection surfaces thereof in accordance with control signals, are arranged in a two-dimensional manner on a semiconductor support of silicon or the like. An example of an exposure apparatus which utilizes such a DMD is, as shown in FIG. 27, structured by a light source 1 which irradiates a laser beam, a lens system 2 which collimates the laser beam irradiated from the light source 1, a DMD 3 which is disposed substantially at a focusing position of the lens system 2, and lens systems 4 and 6 which focus the laser beam that has been reflected at the DMD 3 onto an exposure surface 5. Although the DMD 3 is a reflection-type spatial modulation element, in FIG. 27, for ease of explanation, the laser beam is shown as being emitted to the exposure surface 5 side from the DMD 3 without being deflected.

In this exposure apparatus, the respective micromirrors of the DMD 3 are switched on and off by an unillustrated control apparatus, in accordance with control signals generated in accordance with image data or the like, and modulate (deflect) the laser beam. The exposure surface is exposed to two levels by the modulated laser beam. Here, the lens systems 4 and 6 are structured to serve as magnifying optical systems, and enlarge an exposure area at the exposure surface 5 relative to a surface portion of the DMD 3 at which the micromirrors are disposed.

In the exposure apparatus described above, generally, the micromirrors at the DMD and the exposure surface 5 are set to be mutually conjugative, reflected images from the micromirrors are focused on the exposure surface 5 by the lens systems 4 and 6, and these reflected images expose the exposure surface 5 in the form of beam spots.

However, when the size of the exposure area on the exposure surface 5 is magnified relative to the area of the surface portion of the DMD 3 by the lens systems 4 and 6, the area (spot diameter) of the beam spots on the exposure surface 5 is also magnified in accordance with the magnification rate. Consequently, an MTF (modulation transfer function) characteristic at the exposure surface 5 is reduced in accordance with the magnification rate of the exposure area.

Accordingly, in the exposure apparatus described above, as shown in FIG. 28, a plurality of microlenses 7 may be disposed between the lens system 6 and the exposure surface 5 in a one-to-one correspondence with the respective micromirrors of the DMD 3. The laser beams reflected by the micromirrors are contracted by the microlenses 7. Thus, the spot diameter at the exposure surface 5 is adjusted (reduced) to a desired size.

However, in the exposure apparatus described above, laser emission portions of the light source 1 have some area and are not generally expressed as point light sources. Therefore, as shown in FIG. 27, the laser beams reflected by the micromirrors of the DMD 3 have a certain spreading angle αs corresponding to the area of the laser output portion. As a result, in the exposure apparatus described above, in a case in which microlenses are utilized in order to shrink the spot diameter of the beam spots on the exposure surface 5, a portion of the laser beam that is reflected by a particular micromirror is incident at the microlenses 7 other than the one of the microlenses 7 that corresponds to the particular micromirror. If there is a lot of such stray light SL, the stray light SL passes through the microlenses 7 and forms a ghost image GI on the exposure surface 5. Hence, exposed portions which are noise portions are caused at the exposure surface 5.

Further, for the exposure apparatus described above, not utilizing the microlenses 7 but disposing apertures, which have an opening diameter corresponding to the required spot diameter of the beam spot, between the exposure surface 5 and the lens system 6 and shrinking the beam diameter at the exposure surface 5 with these apertures has been considered. However in a case in which such apertures are used, light amount losses due to the apertures increase in accordance with increases in a rate of contraction of the laser beams, and light usage efficiency is greatly reduced.

SUMMARY OF THE INVENTION

In consideration of the circumstances described above, a major object of the present invention is to provide an exposure head and exposure apparatus capable of adjusting a beam spot which exposes an exposure surface to a desired spot diameter and spot shape without causing the occurrence of stray light or a reduction in optical efficiency.

In order to achieve the object described above, in accordance with a first aspect of the present invention, an exposure head is provided which includes: a light source unit including a plurality of laser emission portions which emit laser beams; a spatial modulation element for modulating the laser beams, including a plurality of pixel portions which change light modulation states in accordance with respective control signals, the pixel portions being arranged in a two-dimensional pattern on a predetermined support; a first optical system for focusing images of the pixel portions of the spatial modulation element; and a plurality of first microlenses arranged in a two-dimensional pattern so as to correspond to the pixel portions, the first microlenses being respectively supported at respective focusing positions of the pixel portions. Light source images of the laser emission portions, which are formed at back side focusing positions of the first microlenses, are projected to a surface that is to be exposed, and the light source images serve as beam spots for exposing the surface that is to be exposed.

In accordance with a second aspect of the present invention, an exposure apparatus is provided which includes an exposure head including: a light source unit including a plurality of laser emission portions which emit laser beams; a spatial modulation element for modulating the laser beams, including a plurality of pixel portions which change light modulation states in accordance with respective control signals, the pixel portions being arranged in a two-dimensional pattern on a predetermined support; a first optical system for focusing images of the pixel portions of the spatial modulation element; and a plurality of first microlenses arranged in a two-dimensional pattern so as to correspond to the pixel portions, the first microlenses being respectively supported at respective focusing positions of the pixel portions. Light source images of the laser emission portions, which are formed at back side focusing positions of the first microlenses, are projected to a surface that is to be exposed, and the light source images serve as beam spots for exposing the surface that is to be exposed.

In accordance with a third aspect of the present invention, an exposure head is provided which includes: a light source unit including a plurality of laser emission portions which emit laser beams; a spatial modulation element for modulating the laser beams, including a plurality of pixel portions which change light modulation states in accordance with respective control signals, the pixel portions being arranged in a two-dimensional pattern on a predetermined support; a first optical system for focusing images of the pixel portions of the spatial modulation element; a plurality of first microlenses for focusing the laser beams, the first microlenses being two-dimensionally arranged at focusing positions of the plurality of pixel portions, at a pitch which is substantially the same as a size of images that are formed at the focusing positions; and a plurality of second microlenses disposed at back side focusing positions of the plurality of first microlenses, the second microlenses focusing real images of the pixel portions respectively on a surface that is to be exposed. The real images of the pixel portions, which are focused by the second microlenses, serve as beam spots for exposing the surface that is to be exposed.

In accordance with a fourth aspect of the present invention, an exposure apparatus is provided which includes an exposure head including: a light source unit including a plurality of laser emission portions which emit laser beams; a spatial modulation element for modulating the laser beams, including a plurality of pixel portions which change light modulation states in accordance with respective control signals, the pixel portions being arranged in a two-dimensional pattern on a predetermined support; a first optical system for focusing images of the pixel portions of the spatial modulation element; and a plurality of first microlenses for focusing the laser beams, the first microlenses being two-dimensionally arranged at focusing positions of the plurality of pixel portions, at a pitch which is substantially the same as a size of images that are formed at the focusing positions; and a plurality of second microlenses disposed at back side focusing positions of the plurality of first microlenses, the second microlenses focusing real images of the pixel portions respectively on a surface that is to be exposed. The real images of the pixel portions, which are focused by the second microlenses, serve as beam spots for exposing the surface that is to be exposed.

BRIEF DESCRIPTION OF THE DRAWINGS

FIG. 8A is a plan view showing positions of exposure beams and scanning lines in a case in which the DMD is not disposed at an angle.

FIG. 8B is a plan view showing positions of exposure beams and scanning lines in a case in which the DMD is disposed at an angle.

FIG. 9A is a perspective view showing structure of a fiber array light source.

FIG. 9B is a partial enlarged view of the fiber array light source shown in FIG. 9A.

FIG. 9C is a plan view showing an arrangement of light emission points at a laser emission portion.

FIG. 9D is a plan view showing another arrangement of light emission points at a laser emission portion.

FIG. 16 is an enlarged view of a vicinity of a first microlens in a projection optical system shown in FIG. 5A.

DESCRIPTION OF THE PREFERRED EMBODIMENTS

Below, embodiments of the present invention will be described in detail with reference to the drawings.

First Embodiment

Figure 1:
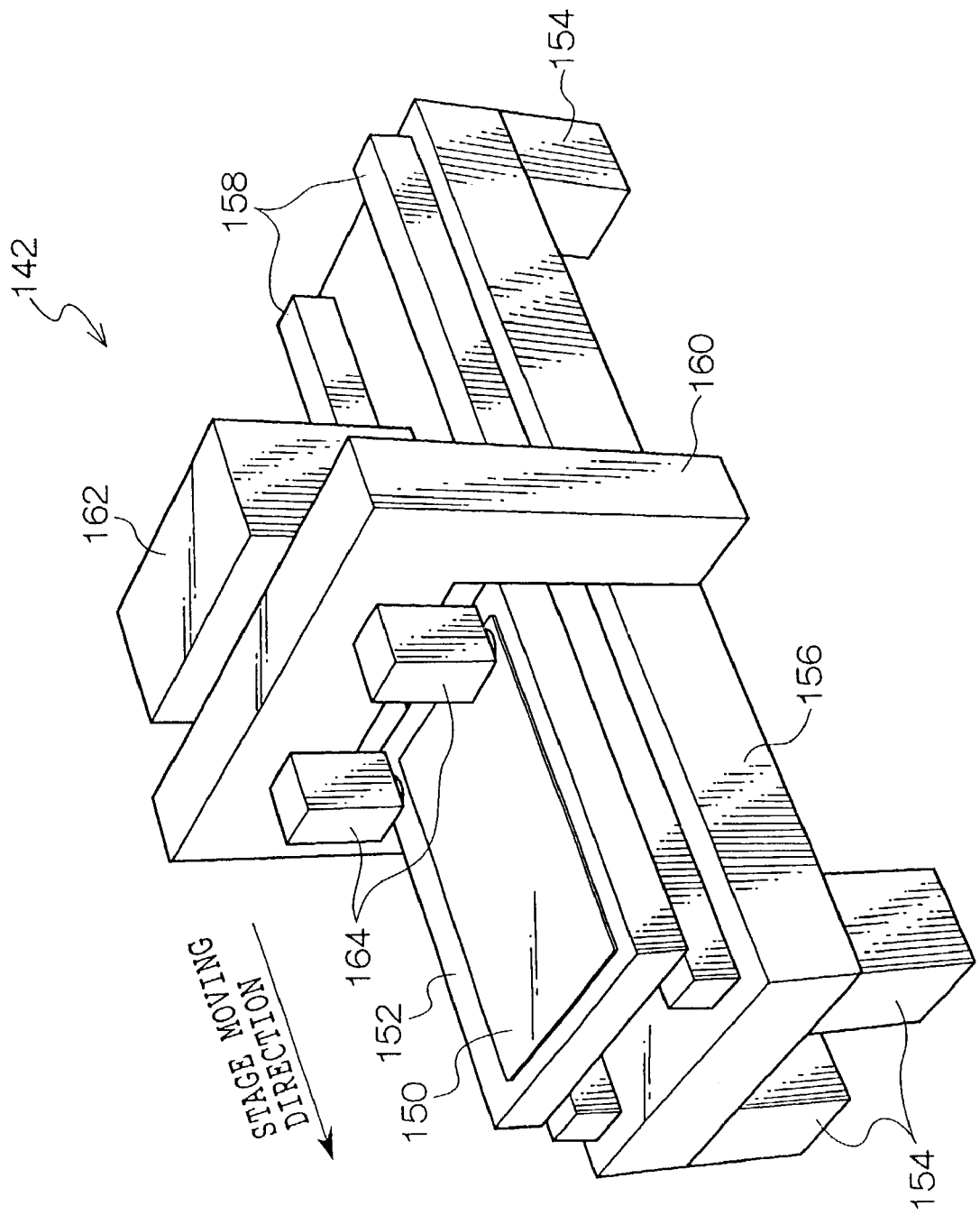
FIG. 1 is a perspective view showing the exterior of an exposure apparatus relating to a first embodiment.

As shown in FIG. 1, an exposure apparatus 142 relating to a first embodiment of the present invention is provided with a flat board-form stage 152, which adsorbs and retains a sheet-form photosensitive material 150 at a surface thereof. Two guides 158, which extend in a stage movement direction, are provided at an upper face of a thick board-form equipment pedestal 156, which is supported at four leg portions 154. The stage 152 is disposed such that a longitudinal direction thereof is oriented in the stage movement direction, and is supported by the guides 158 so as to be reciprocally movable. At this exposure apparatus 142, an unillustrated driving apparatus is provided for driving the stage 152 along the guides 158.

At a central portion of the equipment pedestal 156, an 'n'-like gate 160 is provided so as to straddle a movement path of the stage 152. Respective end portions of the gate 160 are fixed at two side faces of the equipment pedestal 156. Sandwiching the gate 160, a scanner 162 is provided at one side, and a plurality (for example, two) of detection sensors 164 are provided at the other side. The detection sensors 164 detect a leading end and a trailing end of the photosensitive material 150. The scanner 162 and the detection sensors 164 are respectively mounted at the gate 160, and are fixedly disposed upward of the movement path of the stage 152. The scanner 162 and detection sensors 164 are connected to an unillustrated controller which controls the scanner 162 and detection sensors 164.

Figure 2:
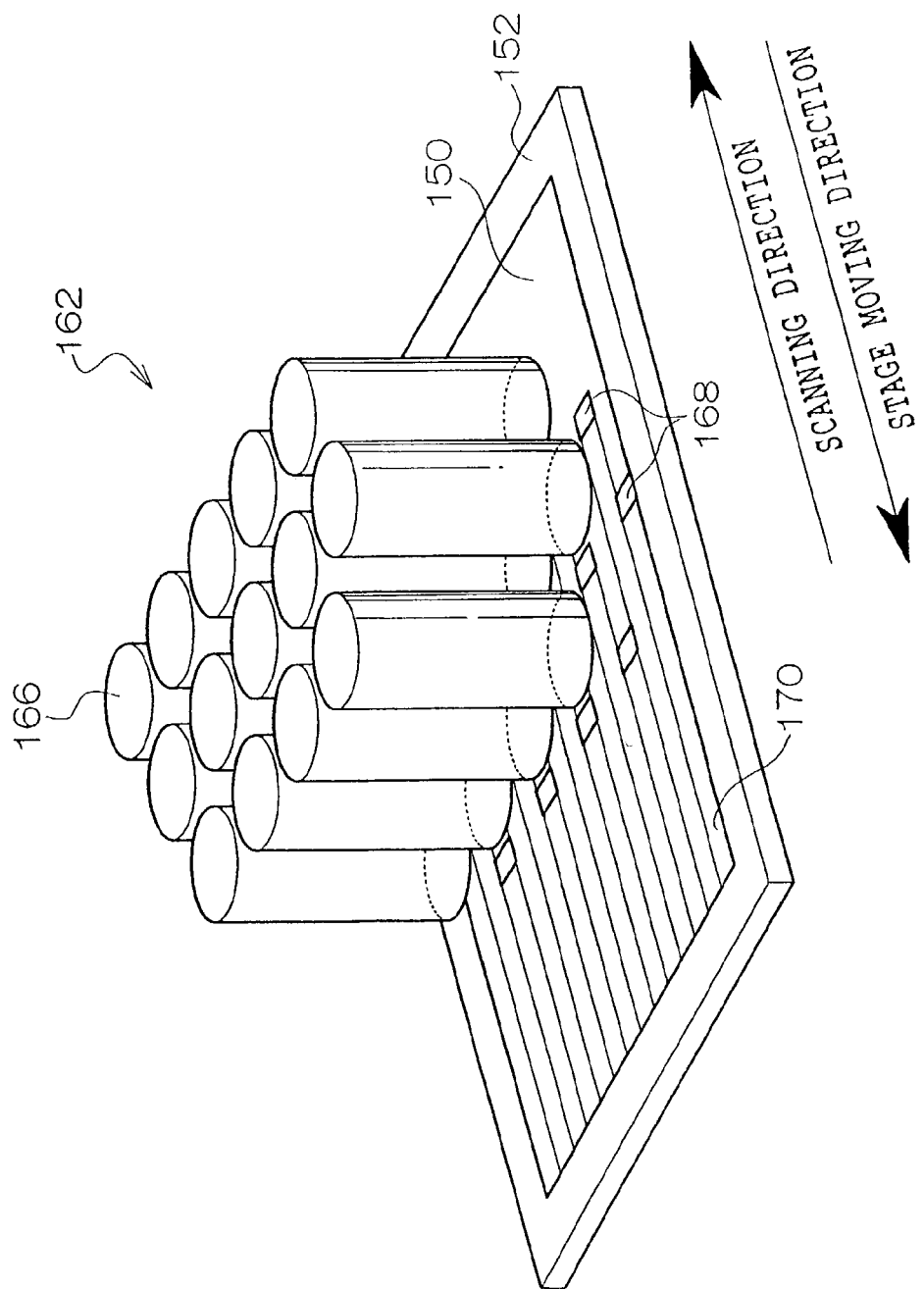
FIG. 2 is a perspective view showing structure of a scanner of the exposure apparatus relating to the first embodiment.
Figure 3A:
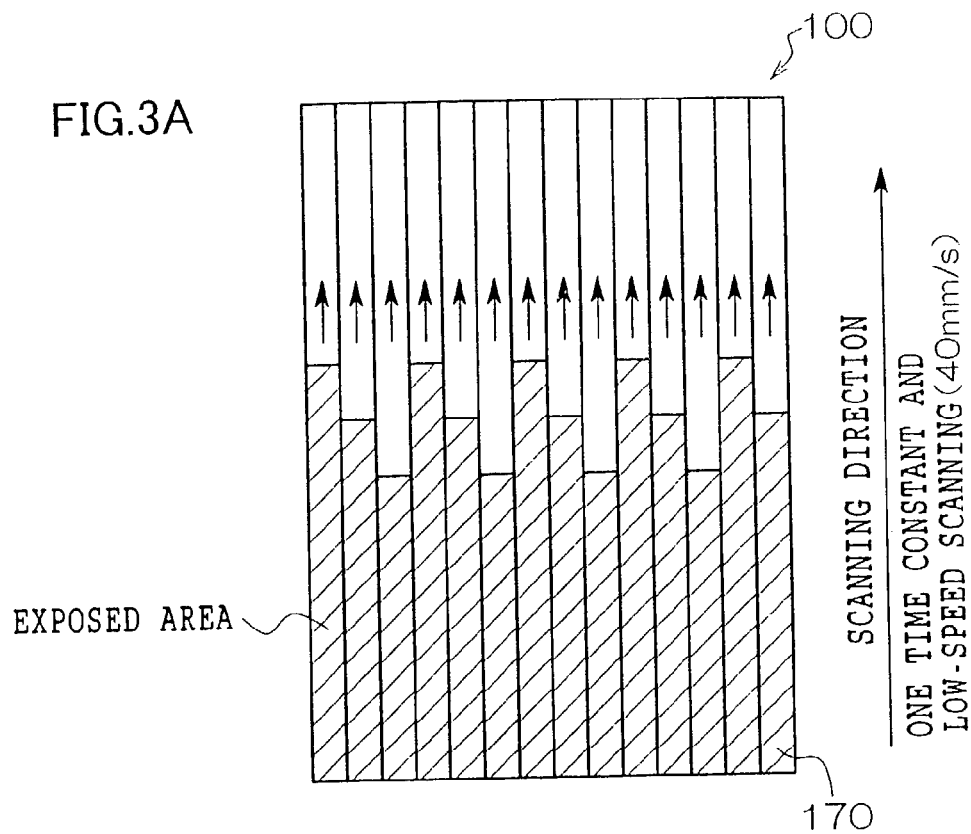
FIG. 3A is a plan view showing exposed regions formed at a photosensitive material.
Figure 3B:
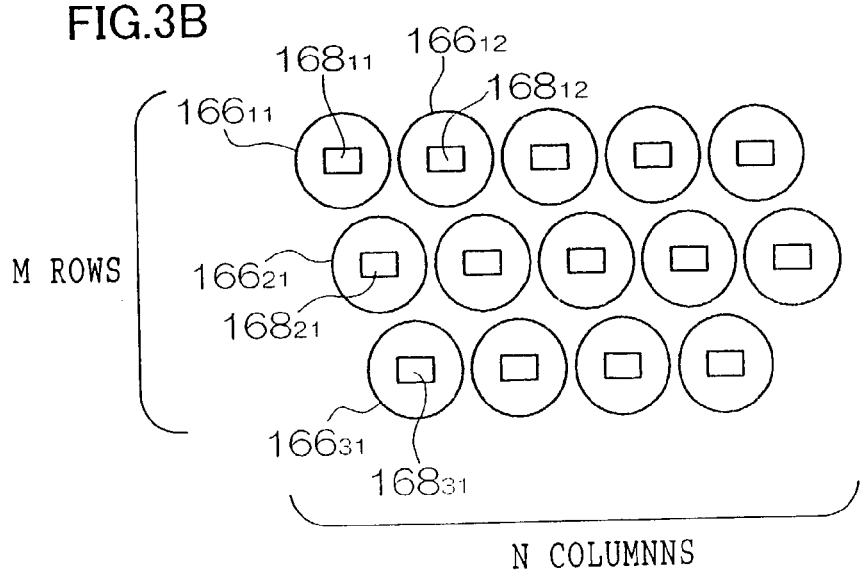
FIG. 3B is a view showing an arrangement of exposure areas due to respective exposure heads.

As shown in FIGS. 2 and 3B, the scanner 162 is equipped with a plurality (for example, fourteen) of exposure heads 166, which are arranged substantially in a matrix pattern with m rows and n columns (for example, three rows and five columns). In this example, in consideration of width of the photosensitive material 150, four of the exposure heads 166 are provided in the third row. Note that when an individual exposure head which is arranged in the m-th row and the n-th column is to be referred to, that exposure head is denoted as exposure head $166_{mn}$.

Exposure areas 168 covered by the exposure heads 166 have rectangular shapes with short sides thereof in a scanning direction. Consequently, in accordance with movement of the stage 152, band-form exposed regions 170 are formed on the photosensitive material 150 at the respective exposure heads 166. Note that when an exposure area formed by an individual exposure head, which is arranged in the m-th row and the n-th column, is to be referred to, that exposure area is denoted as exposure area $168_{mn}$.

As shown in FIGS. 3A and 3B, in each row, the respective exposure heads, which are arranged in a line, are disposed to be offset by a predetermined interval in a row arrangement direction (which interval is an integer multiple (two in the present embodiment) of the long dimension of the exposure areas), such that the band-form exposed regions 170 will be lined up without gaps therebetween in a direction intersecting the scanning direction. Thus, a portion that cannot be exposed between exposure area $168_{11}$ and exposure area $168_{12}$ of the first row can be exposed by exposure area $168_{21}$ of the second row and exposure area $168_{31}$ of the third row.

Figure 4:
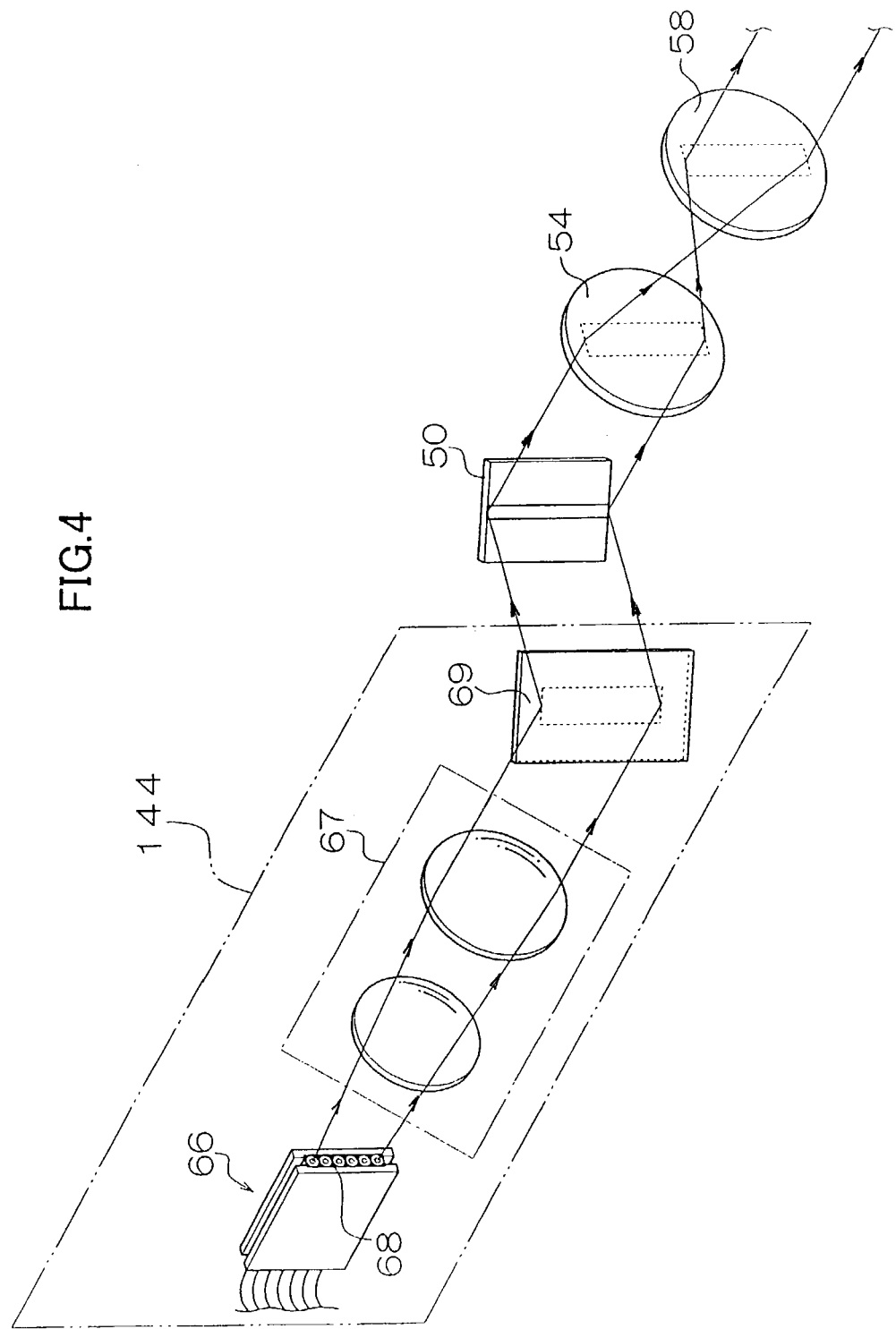
FIG. 4 is a perspective view showing general structure of an exposure head of the exposure apparatus relating to the first embodiment.
Figure 5A:
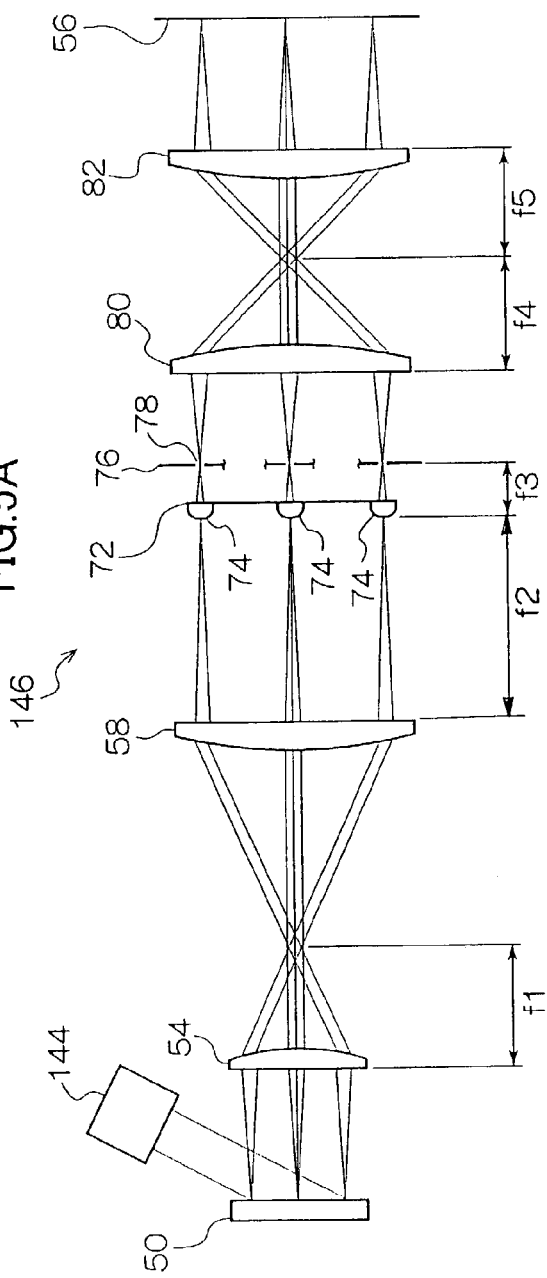
FIG. 5A is a side view showing structure of the exposure head shown in FIG. 4.

As shown in FIGS. 4 and 5A, at each of the exposure areas $166_{11}$ to $166_{mn}$, a digital micromirror device (DMD) 50 is provided to serve as a spatial modulation element for modulating incident light beams at respective pixels in accordance with image data. The DMD 50 is connected with an unillustrated controller, which is provided with a data processing section and a mirror driving control section. At the data processing section of this controller, on the basis of inputted image data, driving signals are generated for driving control of each micromirror at a region of the DMD 50 at the corresponding exposure head 166 which region is to be controlled. The regions that are to be controlled are described later. The mirror driving control section controls the angle of a reflection surface of each micromirror of the DMD 50 at the corresponding exposure head 166, on the basis of the control signals generated at the image data processing section. Control of the angles of the reflection faces is described later.

As shown in FIG. 4, an illumination unit 144 is provided at a light incidence side of the DMD 50. At the illumination unit 144, a fiber array light source 66, a lens system 67 and a mirror 69 are disposed in this order. The fiber array light source 66 is equipped with a laser emission portion at which emission end portions (light emission points) of optical fibers are arranged in a row along a direction corresponding to the direction of the long sides of the exposure area 168. The lens system 67 corrects laser light that is emitted from the fiber array light source 66, and focuses the light on the DMD. The mirror 69 reflects the laser light that has been transmitted through the lens system 67 toward the DMD 50.

Figure 6:
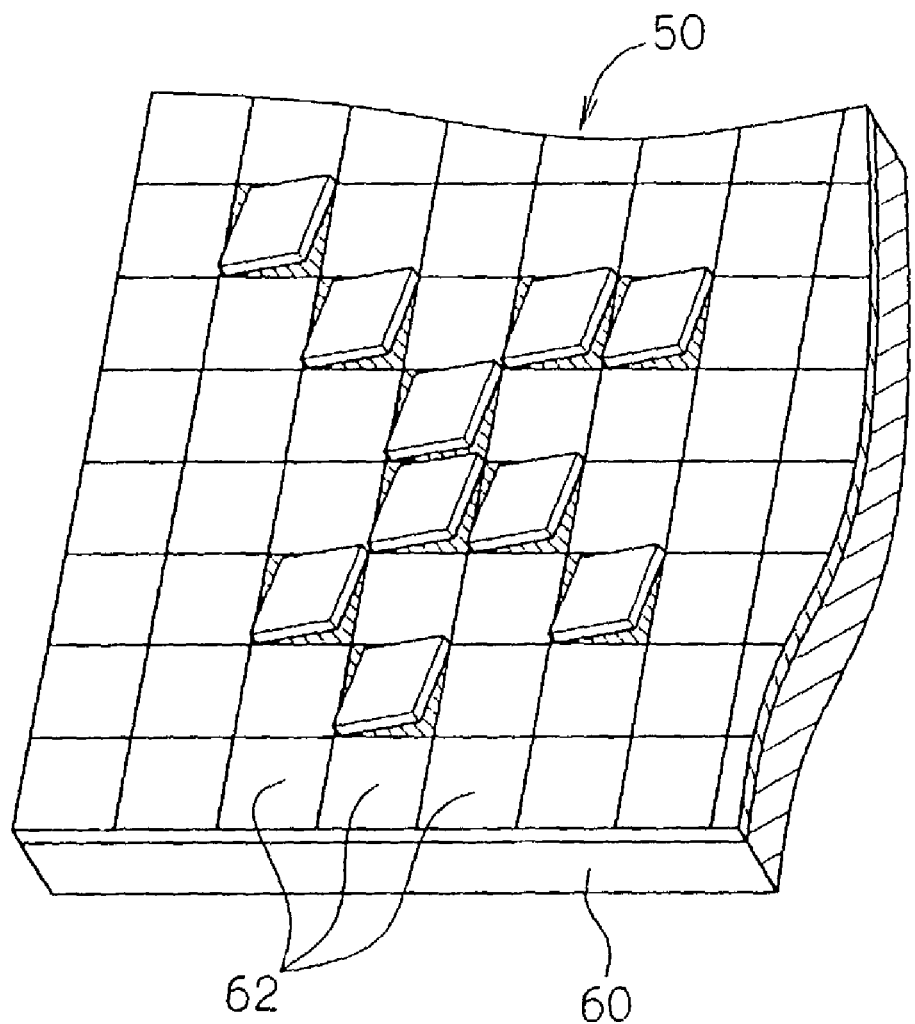
FIG. 6 is a partial enlarged view showing structure of a digital micromirror device (DMD).

As shown in FIG. 6, at the DMD 50, very small mirrors (micromirrors) 62, which are supported by support pillars, are disposed on an SRAM cell (memory cell) 60. The DMD 50 is a mirror device which is structured with a large number (for example, 600 by 800) of these extremely small mirrors, which structure image elements (pixels), arranged in a checkerboard pattern. At each pixel, the micromirror 62 is provided so as to be supported at an uppermost portion of the support pillar. A material with high reflectivity, such as aluminium or the like, is applied by vapor deposition at the surface of the micromirror 62.

Figure 7A:
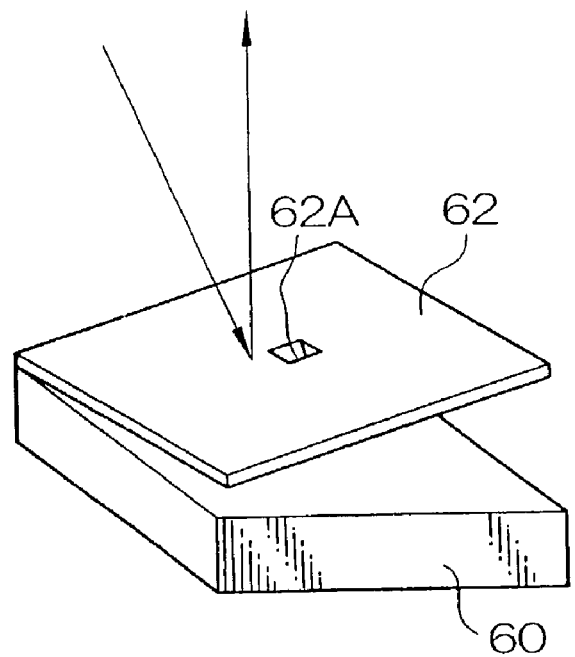
FIGS. 7A and 7B are explanatory views for explaining operation of the DMD.
Figure 7B:
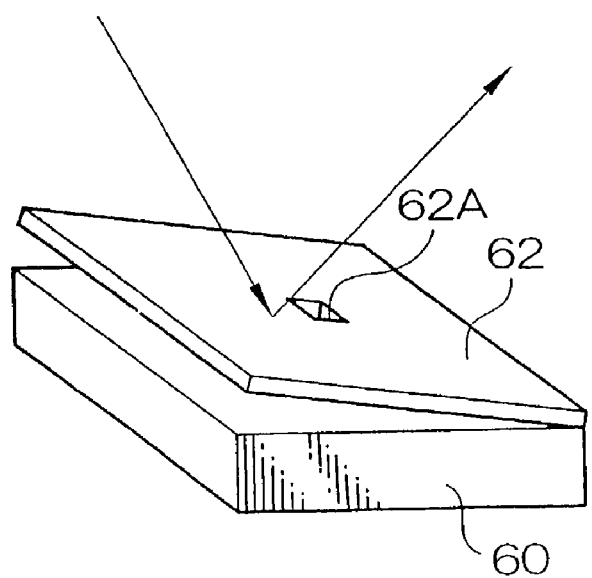

As shown in FIGS. 7A and 7B, a hole-form non-reflective portion 62A is formed at a central portion of the reflective surface of each micromirror 62. Consequently, a light amount distribution of a reflection image formed by the micromirror 62 is lowered for a central vicinity of the micromirror 62 and the overall light amount distribution becomes non-uniform. The reflectivity of the micromirror 62 is at least 90%. The SRAM cell 60, which is fabricated with CMOS silicon gates by a continuous semiconductor memory production line, is disposed directly under the micromirror 62, with the support pillar, which includes a hinge and a yoke, interposed therebetween. The whole of this structure is monolithic (integrated).

When digital signals are written to the SRAM cell 60 of the DMD 50, the micromirrors 62 supported at the support pillars are inclined, about a diagonal, in a range of ±α° (for example, ±10°), relative to the side of the support at which the DMD 50 is disposed. FIG. 7A shows a state in which the micromirror 62 is inclined at +α°, which is an 'ON' state, and FIG. 7B shows a state in which the micromirror 62 is inclined at −α°, which is an 'OFF' state. Accordingly, as a result of control of the inclinations of the micromirrors 62 at the pixels of the DMD 50 in accordance with image signals, as shown in FIG. 6, light that is incident at the DMD 50 is reflected in directions of inclination of the respective micromirrors 62.

FIG. 6 shows a portion of the DMD 50 enlarged, and shows an example of a state in which the micromirrors 62 are controlled to +α° and −α°. The ON-OFF control of the respective micromirrors 62 is carried out by the unillustrated controller connected to the DMD 50. Light that is reflected by the micromirrors 62 in the ON state is modulated to an exposing state and enters a projecting optical system 146, which is provided at the light emission side of the DMD 50 (see FIG. 5). Light that is reflected by the micromirrors 62 in the OFF state is modulated to a non-exposing state and enters a light-absorbing body (not shown).

It is preferable if the DMD 50 is disposed to be slightly inclined, such that a short side thereof forms a predetermined angle θ (for example, 0.1° to 0.5°) with the scanning direction. FIG. 8A shows scanning tracks of reflection images (exposure beams) 53 formed by the micromirrors in a case in which the DMD 50 is not inclined. FIG. 8B shows scanning tracks of the exposure beams 53 in the case in which the DMD 50 is inclined.

At the DMD 50, a large number (for example, 800) of micromirrors are arranged in a long side direction (a row direction) to form a micromirror row, and a large number (for example, 600) of these micromirror rows are arranged in a short side direction. As shown in FIG. 8B, when the DMD 50 is inclined, a pitch $P_2$ of scanning paths (scanning lines) of the exposure beams 53 from the micromirrors is tighter than a pitch $P_1$ of scanning lines in the case in which the DMD 50 is not inclined. Thus, resolution can be greatly improved. However, because the angle of inclination of the DMD 50 is very small, a scanning width $W_2$ in the case in which the DMD 50 is inclined is approximately the same as a scanning width $W_1$ in the case in which the DMD 50 is not inclined.

The same scanning line will be superposingly exposed by different micromirror rows (multiple exposure). As a consequence of this multiple exposure, exposure positions can be controlled in very fine amounts, and high accuracy exposure can be implemented. Further, by control in very fine amounts of exposure positions at boundary lines between the plurality of exposure heads arranged in the scanning direction, joins without steps can be formed.

Instead of inclining the DMD 50, the micromirrors may be disposed in a staggered pattern in which the micromirror rows are shifted by predetermined intervals in the direction intersecting the scanning direction, and the same effects can be obtained.

As shown in, for example, FIG. 9A, the fiber array light source 66 is equipped with a plurality (for example, six) of laser modules 64. At each of the laser modules 64, one end of a multi-mode optical fiber 30 is connected. At the other end of the multi-mode optical fiber 30, an optical fiber 31, whose core diameter is the same as that of the multi-mode optical fiber 30 and whose cladding diameter is smaller than that of the multi-mode optical fiber 30, is connected. As shown in FIG. 9C, emission end portions of the optical fibers 31 (light emission points) are arranged in a single row along the direction intersecting the scanning direction, to structure a laser emission portion 68. Note that the light emission points may be arranged in two rows along the direction intersecting the scanning direction, as shown in FIG. 9D. This arrangement of the optical fibers 31 is, as described later, determined in accordance with a spot shape of beam spots that are projected at a surface to be exposed 56.

As is shown in FIG. 9B, the emission end portions of the optical fibers 31 are interposed and fixed between a pair of support plates 65, which have flat faces. Furthermore, a transparent protective plate 63, of glass or the like, is disposed at the light emission side of the optical fibers 31 in order to protect end faces of the optical fibers 31. The protective plate 63 may be disposed to be closely contacted with the end faces of the optical fibers 31, and may be disposed such that the end faces of the optical fibers 31 are sealed. The emission end portions of the optical fibers 31 have high optical density, tend to attract dust, and are susceptible to deterioration. However, by disposing the protective plate 63, the adherence of dust can be prevented and deterioration can be slowed.

In the example of FIG. 9B, because the emission ends of the optical fibers 31 with smaller cladding diameters are arranged in a single row without gaps therebetween, some of the multi-mode optical fibers 30, which are each between two of the multi-mode optical fibers 30 that are adjacent thereto at the section with larger cladding diameters, are piled up on the adjacent two of the multi-mode optical fibers 30. The emission end of the optical fiber 31 that is joined to one of the multi-mode optical fibers 30 that are piled up is arranged so as to be sandwiched between the two emission ends of the multi-mode optical fibers 31 that are joined to the two multi-mode optical fibers 30 that are adjacent to that multi-mode optical fiber 30 at the section with larger cladding diameters.

Figure 10:
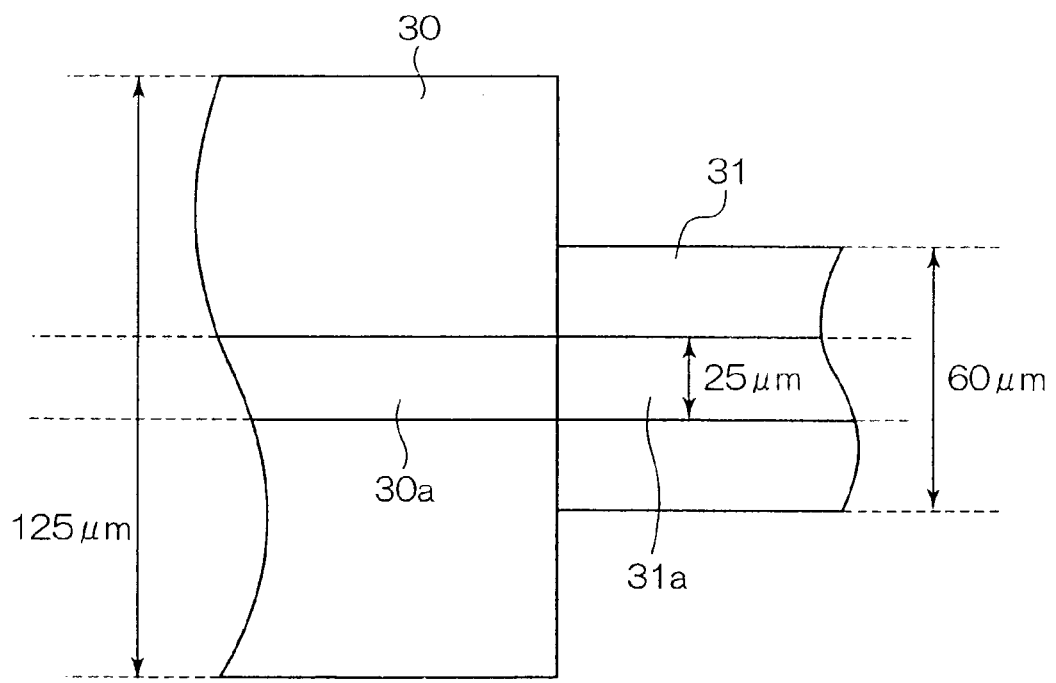
FIG. 10 is a view showing structure of a multi-mode optical fiber.

These optical fibers can be obtained by, for example, as shown in FIG. 10, coaxially joining a 1 to 30 cm length of the optical fiber 31 with the smaller cladding diameter to a distal end portion, at the laser light emission side, of the multi-mode optical fiber 30 with the larger cladding diameter. The two optical fibers 30 and 31 are joined by fusing an incidence end face of the optical fiber 31 to an emission end face of the multi-mode optical fiber 30 such that central axes of the two fibers coincide. As described above, a diameter of a core 31*a* of the optical fiber 31 has the same magnitude as a diameter of a core 30*a* of the multi-mode optical fiber 30.

Further, a short-strip optical fiber, at which the optical fiber whose cladding diameter is smaller is fused to an optical fiber whose length is short and whose cladding diameter is larger, may be joined at the emission end of the multi-mode optical fiber 30 via a ferrule, an optical connector or the like. Because this joining is carried out using the connector or the like so as to be detachable, replacement of a peripheral end portion, in a case in which the optical fiber whose cladding diameter is smaller has been damaged or the like, is simple, and costs required for maintenance of the exposure head can be reduced. Herebelow, the optical fiber 31 may on occasion be referred to as an exposure end portion of the multi-mode optical fiber 30.

As the multi-mode optical fiber 30 and the multi-mode optical fiber 31, any of step index-type optical fibers, graded index-type optical fibers and multiplex-type optical fibers can be used. For example, a step index-type optical fiber produced by Mitsubishi Cable Industries, Ltd. can be used. In the present embodiment, the multi-mode optical fiber 30 and the optical fiber 31 are step index-type optical fibers.

The multi-mode optical fiber 30 has cladding diameter=125 µm, core diameter=25 µm, NA=0.2, and transmittance of an end face coating=99.5% or more. The optical fiber 31 has cladding diameter=60 µm, core diameter=25 µm, and NA=0.2.

Commonly, with laser light in the infrared region, propagation losses increase as the cladding diameter of an optical fiber becomes smaller. Accordingly, suitable cladding diameters are determined in accordance with a wavelength range of laser light. However, the shorter the wavelength, the smaller the propagation losses. Hence, with laser light with a wavelength of 405 nm, as emitted from a GaN-based semiconductor laser, propagation losses are barely increased at all when a cladding thickness ((cladding diameter–core diameter)/2) is set to around half a cladding thickness for a case of propagating infrared light in an 800 nm wavelength region or around a quarter of a cladding thickness for a case of propagating infrared light in a 1.5 µm wavelength region, the latter of which is used for communications. Accordingly, the cladding diameter can be reduced to 60 µm.

The cladding diameter of the optical fiber 31 is not limited to 60 µm. An optical fiber which is employed in a conventional fiber light source has a cladding diameter of 125 µm. However, because focusing depth becomes deeper as the cladding diameter become smaller, it is preferable if the cladding diameter of this multimode optical fiber is 80 µm or less, more preferably 60 µm or less, and even more preferably 40 µm or less. On the other hand, given that the core diameter needs to be at least 3 to 4 µm, it is preferable that the cladding diameter of the optical fiber 31 is at least 10 µm.

Figure 11:
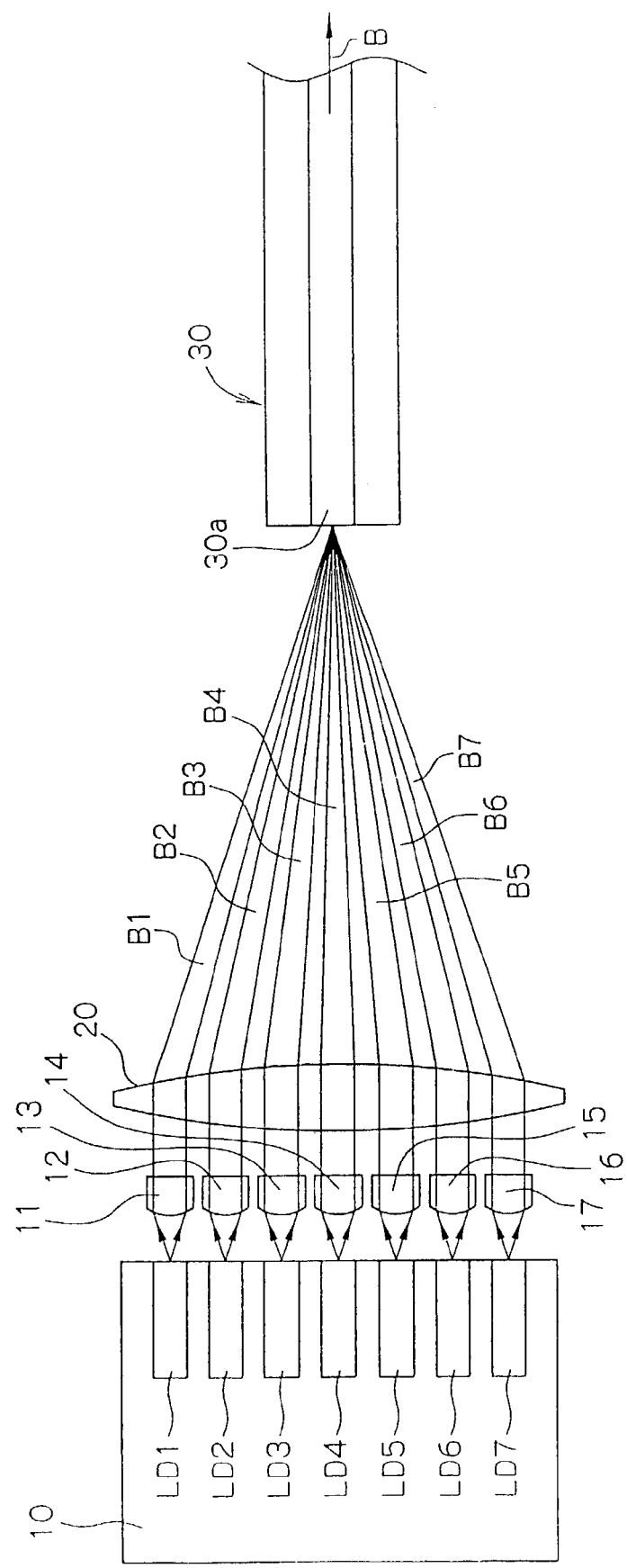
FIG. 11 is a plan view showing structure of a multiplex laser light source.

The laser module 64 is structured by a multiplexed laser light source (fiber light source) shown in FIG. 11. This multiplex laser light source is structured with a plurality (for example, seven) of chip-form lateral multi-mode or single-mode GaN-related semiconductor lasers LD1, LD2, LD3, LD4, LD5, LD6 and LD7, collimator lenses 11, 12, 13, 14, 15, 16 and 17, a single condensing lens 20, and one of the multi-mode optical fibers 30. The GaN-related semiconductor lasers LD1 to LD7 are fixedly arranged on a heat block 10. The collimator lenses 11 to 17 are provided in correspondence with the GaN-related semiconductor lasers LD1 to LD7, respectively. Note that the number of semiconductor lasers is not limited to seven.

The GaN-related semiconductor lasers LD1 to LD7 all have a common oscillation wavelength (for example, 405 nm), and a common maximum output (for example, 100 mW with multi-mode lasers, 30 mW with single-mode lasers). For the GaN-related semiconductor lasers LD1 to LD7, lasers can be utilized which are provided with an oscillation wavelength different from the above-mentioned 405 nm, in a wavelength range of 350 nm to 450 nm.

Figure 12:
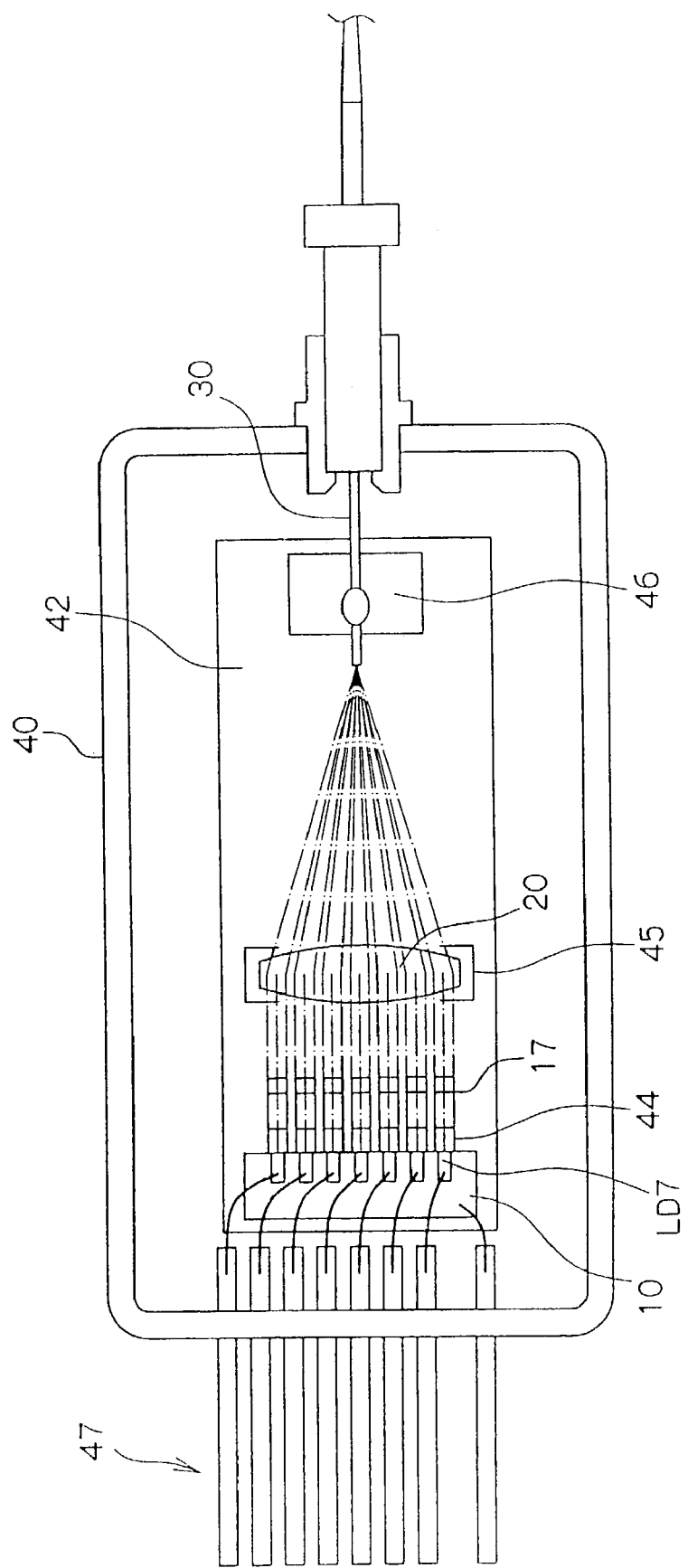
FIG. 12 is a plan view showing structure of a laser module.
Figure 13:
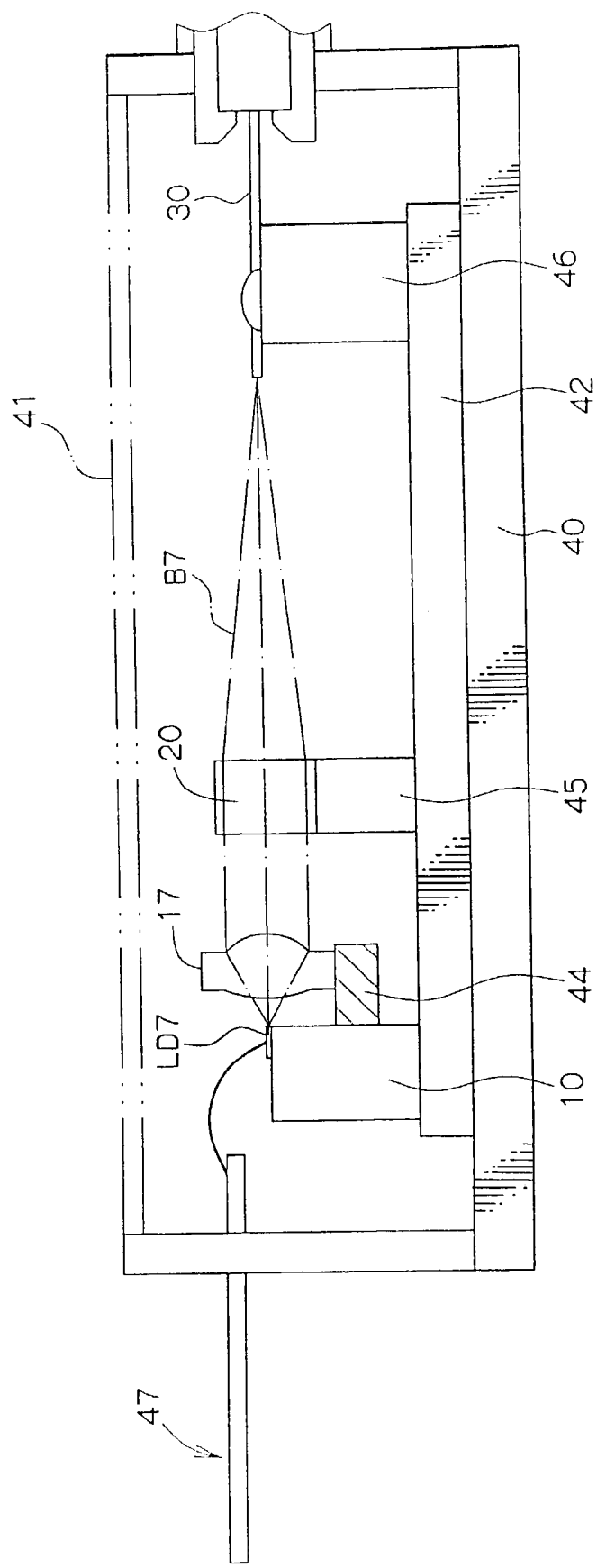
FIG. 13 is a side view showing structure of the laser module shown in FIG. 12.

As shown in FIGS. 12 and 13, the above-described multiplex laser light source, together with other optical elements, is accommodated in a box-like package 40, which opens upward. The package 40 is provided with a package lid 41 prepared so as to close this opening of the package 40. After an air removal treatment, sealed gas is introduced and the opening of the package 40 is closed by the package lid 41. Thus, the above-described multiplex laser light source is hermetically sealed in a sealed space formed by the package 40 and the package lid 41.

A base plate 42 is fixed at a lower face of the package 40. The heat block 10, a condensing lens holder 45 and a fiber holder 46 are attached at an upper face of the baseplate 42. The condensing lens holder 45 holds the condensing lens 20. The fiber holder 46 holds an incidence end portion of the multi-mode optical fiber 30. An opening is formed in a wall face of the package 40. The emission end portion of the multi-mode optical fiber 30 is passed through this opening and led out to outside the package.

A collimator lens holder 44 is attached at a side face of the heat block 10, and holds the collimator lenses 11 to 17. Openings are formed in a lateral wall face of the package 40. Wiring 47, which supplies driving current to the GaN-related semiconductor lasers LD1 to LD7, is passed through these openings and led out to outside the package.

Note that in FIG. 12, in order to alleviate complexity of the drawing, of the plurality of GaN-related semiconductor lasers, only the GaN-related semiconductor laser LD7 is marked with a reference numeral, and of the plurality of collimator lenses, only the collimator lens 17 is marked with a reference numeral.

Figure 14:
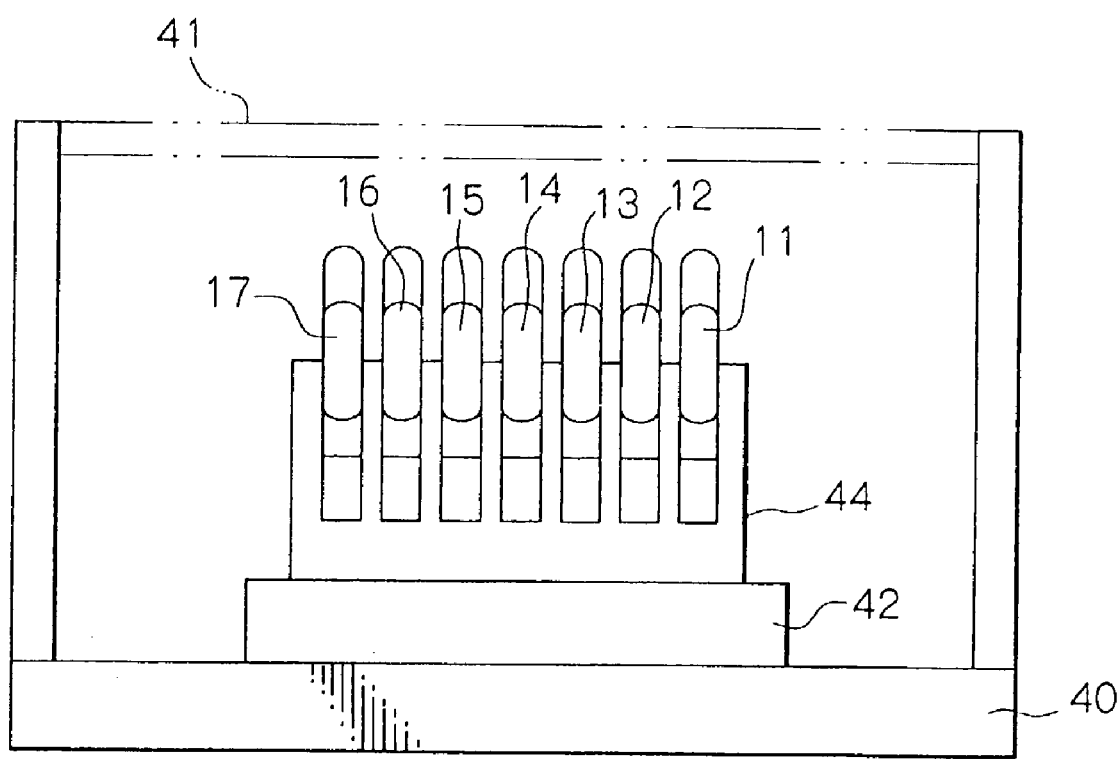
FIG. 14 is a partial side view showing structure of the laser module shown in FIG. 12.

FIG. 14 shows the collimator lenses 11 to 17 and mounting portions thereof, as viewed from front faces thereof. Each of the collimator lenses 11 to 17 has a long, narrow, cut-down shape with parallel flat faces defining a region that includes an optical axis of a circular-form lens which is provided with an aspherical surface. The collimator lenses with this long, narrow shape may be formed, for example, by molding-formation of resin or optical glass. The collimator lenses 11 to 17 are closely disposed in a direction of arrangement of light emission points of the GaN-related semiconductor lasers LD1 to LD7 (the left-right direction in FIG. 14) such that the length directions of the collimator lenses 11 to 17 cross the direction of arrangement of the light emission points.

As the GaN-related semiconductor lasers LD1 to LD7, lasers may be employed which are provided with an active layer with a light emission width of 2 µm, and which respectively emit laser beams B1 to B7 in forms which widen at angles of, for example, 10° and 30° with respect, respectively, to a direction parallel to the active layers and a direction perpendicular to the active layers. These GaN-related semiconductor lasers LD1 to LD7 are disposed such that the light emission points are lined up in a single row in the direction parallel to the active layers.

Accordingly, the laser beams B1 to B7 emitted from the respective light emission points are incident, respectively, on the collimator lenses 11 to 17 having the long, narrow forms described above, in states in which the direction for which the spreading angle of the beam is greater coincides with the length direction of the lens and the direction in which the spreading angle is smaller coincides with a width direction (a direction intersecting the length direction). Specifically, the width of each of the collimator lenses 11 to 17 is 1.1 mm and the length thereof is 4.6 mm, and the laser beams B1 to B7 incident thereat have beam diameters in the horizontal direction and the vertical direction of 0.9 mm and 2.6 mm, respectively. Further, each of the collimator lenses 11 to 17 has a focusing length f=3 mm, NA=0.6 and lens arrangement pitch=1.25 mm.

The condensing lens 20 is cut away in a long, narrow shape with parallel flat faces defining a region that includes an optical axis of a circular-form lens which is provided with an aspherical surface, and is formed in a shape which is long in the direction of arrangement of the collimator lenses 11 to 17 (i.e., the horizontal direction) and short in a direction perpendicular thereto. The condensing lens 20 has a focusing distance $f_2$=23 mm and NA=0.2. The condensing lens 20 is also formed by, for example, molding-formation of resin or optical glass.

Now, the projecting optical system 146 provided at the light reflection side of the DMD 50 at the exposure head 166 will be described. As shown in FIG. 5A, the projecting optical system 146 is provided at the exposure head 166 for projecting a light source image on the surface to be exposed 56 at the light reflection side of the DMD 50. At the projecting optical system 146, a pair of lens systems 54 and 58, a microlens array 72, an aperture array 76, and a pair of lens systems 80 and 82 are disposed in this order from the DMD 50 side toward the surface to be exposed 56.

Here, the lens systems 54 and 58 are structured to serve as a magnifying optical system, and enlarge a cross-sectional area of optical flux that has been reflected by the DMD 50. Consequently, the area on the surface to be exposed 56 of the exposure area 168 due to the optical flux reflected by the DMD 50 is magnified to a desired size. At the microlens array 72, a plurality of first microlenses 74 are integrally formed in a one-to-one correspondence with the micromirrors 62 of the DMD 50 which reflect the light from the illumination unit 144. The first microlenses 74 are disposed on respective optical axes of laser beams which have been transmitted through the lens systems 54 and 58. At the aperture array 76, a plurality of apertures (open diaphragms) 78 are provided in a one-to-one correspondence with the plurality of first microlenses 74 at the microlens array 72.

In this projecting optical system 146, a focusing distance of the lens system 54 is f1 and a focusing distance of the lens system 58 is f2. The micromirrors 62 of the DMD 50 are disposed at a front side focusing position of the lens system 54. The lens systems 54 and 58 are disposed at co-focusing positions whose back side and front side focusing positions, respectively, coincide. The microlens array 72 is disposed at a back side focusing position of the lens system 58. Accordingly, the micromirrors 62 and the first microlenses 74 are mutually conjugative. A focusing distance of the first microlenses 74 is f3. The aperture array 76 is disposed at a back side focusing position of the first microlenses 74. Consequently, the first microlenses 74 and the apertures 78 constitute a telecentric optical system, and flux lines that pass through the centers of the apertures 78 are parallel to optical axes of the lens system 54, the lens system 58 and the first microlenses 74, even at an image side (the side of the surface to be exposed 56).

The lens systems 80 and 82 are structured to serve as, for example, a unit magnification optical system. The lens systems 80 and 82 focus a real image group on the surface to be exposed 56. The real image group is a collection of real images of the light source 66, which are respectively focused by the plurality of first micromirrors 74. A focusing distance of the lens system 80 is f4, and a focusing distance of the lens system 82 is f5. The apertures 78 at the aperture array 76 are disposed at a front side focusing position of the lens system 80. The lens systems 80 and 82 are disposed at co-focusing positions whose back side and front side focusing positions, respectively, coincide. The surface to be exposed 56 is adjusted to be positioned at a back side focusing position of the lens system 82. Consequently, the apertures 78 and the surface to be exposed 56 are mutually conjugative. Note that although the lens systems 54, 58, 80 and 82 of the projecting optical system 146 are each shown as a single lens in FIG. 5, each may be a lens system in which a plurality of lenses (for example, a convex loans and a concave lens) are combined.

At the projecting optical system 146, the spot diameter and spot shape of beam spots projected at the surface to be exposed 56 are determined in accordance with design factors such as the resolution of an exposure pattern formed at the exposed region 170, a scanning speed of the exposure head 166, magnitude of the inclination angle of the DMD 50 with respect to the scanning direction, characteristics of the photosensitive material 150, and the like. Moreover, an aperture diameter and aperture shape of the apertures 78 are specified in accordance with the spot diameter and spot shape of the beam spots to be projected at the surface to be exposed 56. Furthermore, the focusing distance f3 of the first microlenses 74 is specified in accordance with the opening diameter of the apertures 78.

Figure 5C:
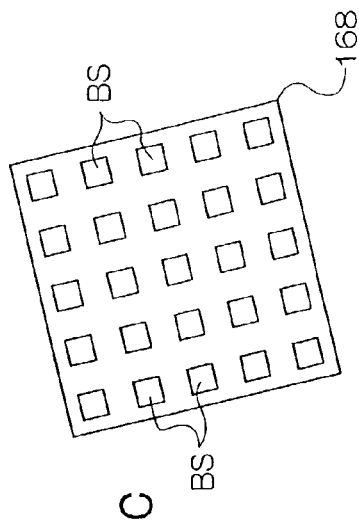
FIGS. 5B and 5C are plan views of exposure areas due to the exposure head.
Figure 5B:
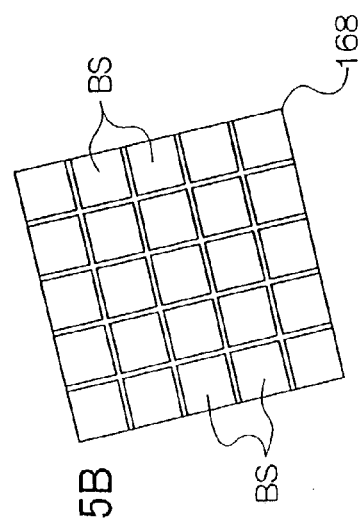

Operation of the first microlenses 74 at the projecting optical system 146 will be described with reference to FIGS. 5A to 5C. The lens systems 54 and 58 structuring the enlarging optical system enlarge the cross-sectional area of optical flux that has been reflected by the DMD 50. Consequently, the area of the exposure area 168 at the surface to be exposed 56 is enlarged to the desired size. Here, because the laser beams that have been reflected by the micromirrors 62 of the DMD 50 pass through the lens systems 54 and 58, beam diameters thereof are enlarged in accordance with a magnification ratio of the lens systems 54 and 58. If the microlens array 72 and the aperture array 76 were not disposed in the system, then, as shown in FIG. 5B, the spot diameter of each beam spot BS projected at the surface to be exposed 56 would be large in accordance with the size of the exposure area 168. Accordingly, even with scanning exposure as shown in FIG. 8A, an MTF (modulation transfer function) characteristic of the exposure area 168 would be reduced in accordance with the magnification ratio of the lens systems 54 and 58.

To prevent the MTF characteristic from falling as described above, the first microlenses 74, which have a positive lens power, are disposed in the projecting optical system 146 in a one-to-one correspondence with the micromirrors 62 of the DMD 50, at the back side focusing position of the lens system 58. The first microlenses 74 reduce the beam diameters of the laser beams that have been enlarged by the lens systems 54 and 58. As a result, as shown in FIG. 5C, even if the exposure area 168 is enlarged to a high magnification by the lens systems 54 and 58, the spot diameters of the beam spots BS are contracted to a required size, and the reduction in the MTF characteristic at the surface to be exposed 56 can be avoided.

Figure 15:
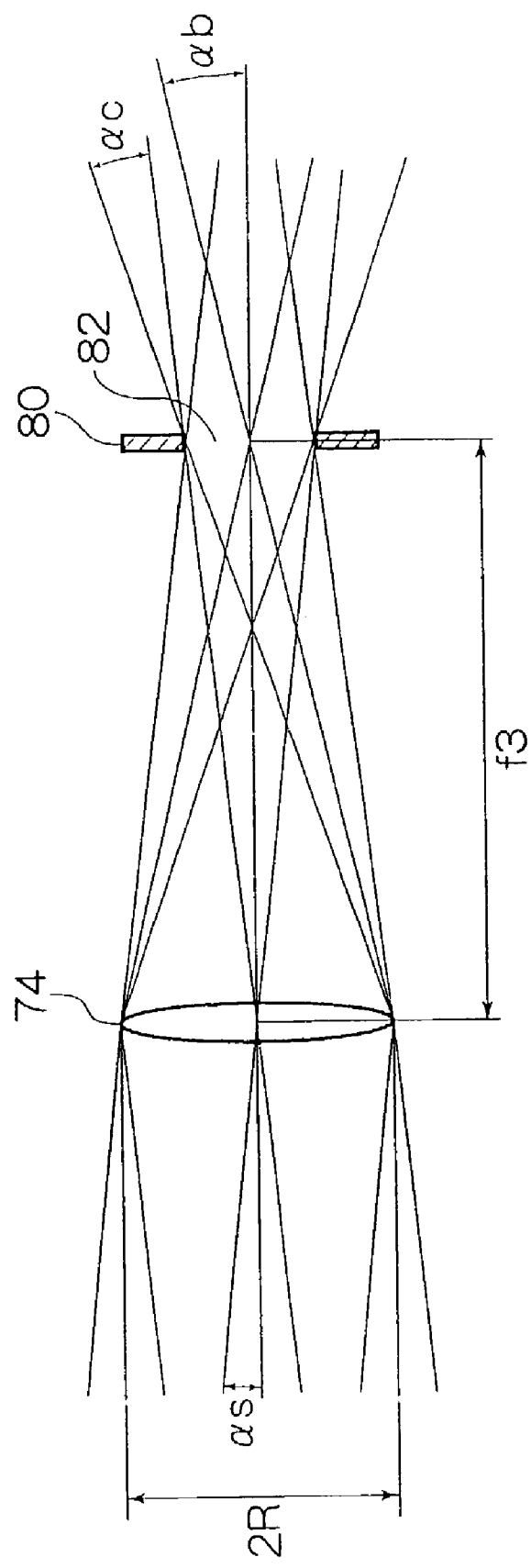
FIG. 15 is a side view showing structure of a first microlens and an aperture of the exposure head shown in FIG. 5A.

Next, a method for specifying the focusing distance f3 of the first microlenses 74 will be specifically described. As shown in FIG. 15, if a size (diameter) of reflected images of the micromirrors 62 which are focused at the back side focusing position of the lens system 58 is 2R, the opening diameter of the first microlens 74 is set to 2R and the opening diameter of the aperture 78 is set to 2R/n. Here, n is a contraction ratio of the opening diameter of the aperture 78 relative to the opening diameter of the first microlens 74. This value n is determined in accordance with the spot diameter of the beam spot BS.

A theoretical condition in which all of the optical flux that is transmitted through the first microlens 74 is transmitted through the aperture 78 is considered. Here, if a spreading angle of the optical flux toward a light source side from the first microlens 74 is set to αs, this spreading angle as is found by the following equation (1).

$$\alpha s = (R/n)/f3 \quad (1)$$

The focusing distance of the first microlens 74 is found from the above equation (1) by the following equation (2).

$$f3 = (R/n)/\alpha s \quad (2)$$

If the focusing distance f3 of the first microlens 74 is specified to a value calculated by the above equation (2), then, as shown in FIG. 15, light that has passed through the first microlens 74 is, theoretically, not blocked by the aperture 78 (in other words, the occurrence of light amount losses does not arise) and is emitted from the aperture 78 to the surface to be exposed 56 side thereof. However, the light transmitted through the first microlens 74 will include light that becomes noise components, such as diffracted light due to aberration of the first microlens 74, scattered light due to scattering and the like, and the light of such noise components is effectively blocked by the aperture 78. Hence, in practice, a small light amount loss will be caused by the aperture 78. Furthermore, the focusing distance f3 obtained by equation (2) is a theoretical optimal value for minimizing light amount losses. Therefore, disposing the apertures 78 at a slight separation forward or rearward from the back side focusing position of the first microlenses 74 in the exposure head 166 is allowable, with due consideration for the ability of the apertures 78 to form the beam spots BS, losses due to noise light, and the like.

A spreading angle of light emitted from the apertures 78 in a case in which the focusing distance f3 of the first microlenses 74 is set in accordance with formula (2) as described above will be described. If a spreading angle $\alpha b$ of light that passes through the centers of the apertures 78 is considered, the following equation (3) is obtained.

$$\alpha b = R/f3 \quad (3)$$
$$= R/\{(R/n)/\alpha s\}$$
$$= n \times \alpha s$$

As is clear from the above equation (3), the optical flux from the first microlenses 74 is contracted and illumination areas corresponding to the apertures 78 contract. Accordingly, the spreading angle $\alpha b$ is increased. A spreading angle of light at opening edges of the apertures 78 is larger than the spreading angle $\alpha b$ of the light at the centers. If an amount by which this spreading angle is larger is $\alpha c$, a relationship $\alpha c = \alpha s$ stands. Consequently, a maximum width of light passing through the apertures 78 $\alpha m$ is found by the following equation (4).

$$\alpha m = \alpha b + \alpha c = (1+n)\alpha s \quad (4)$$

Next, a relationship between the spot shape of the beam spot BS and the form of an outline of the laser emission portion 68 at the fiber array light source 66 will be described. As explained earlier, at the projecting optical system 146, the first microlenses 74 and the micromirrors 62 are conjugative through the lens systems 54 and 58, and the apertures 78 are disposed at the back side focusing position of the first microlenses 74. Consequently, as shown in FIGS. 16 and 17, light source images L1 of the laser emission portion 68 are respectively formed at the back side focusing position of the lens system 54 and the apertures 78. Hence, in the projecting optical system 146, the light source images formed at the apertures 78 are projected through the lens systems 80 and 82 onto the surface to be exposed 56, and these light source images serve as the beam spots BS and expose the surface to be exposed 56.

When a light source image of the laser emission portion 68 is projected on the surface to be exposed 56 as a beam spot BS, as described above, an outline shape of the beam spot BS and an outline shape of the laser emission portion 68 along directions intersecting the optical axis thereof are substantially similar overall. Accordingly, if the outline form of the laser emission portion 68 along the directions intersecting the optical axis is made similar to the spot shape required for the beam spot BS and the opening shape of the apertures is made to be substantially similar to the spot shape of the beam spot BS, light losses when the laser beam emitted from the laser emission portion 68 passes through the apertures 78 can be suppressed.

Figure 17A:
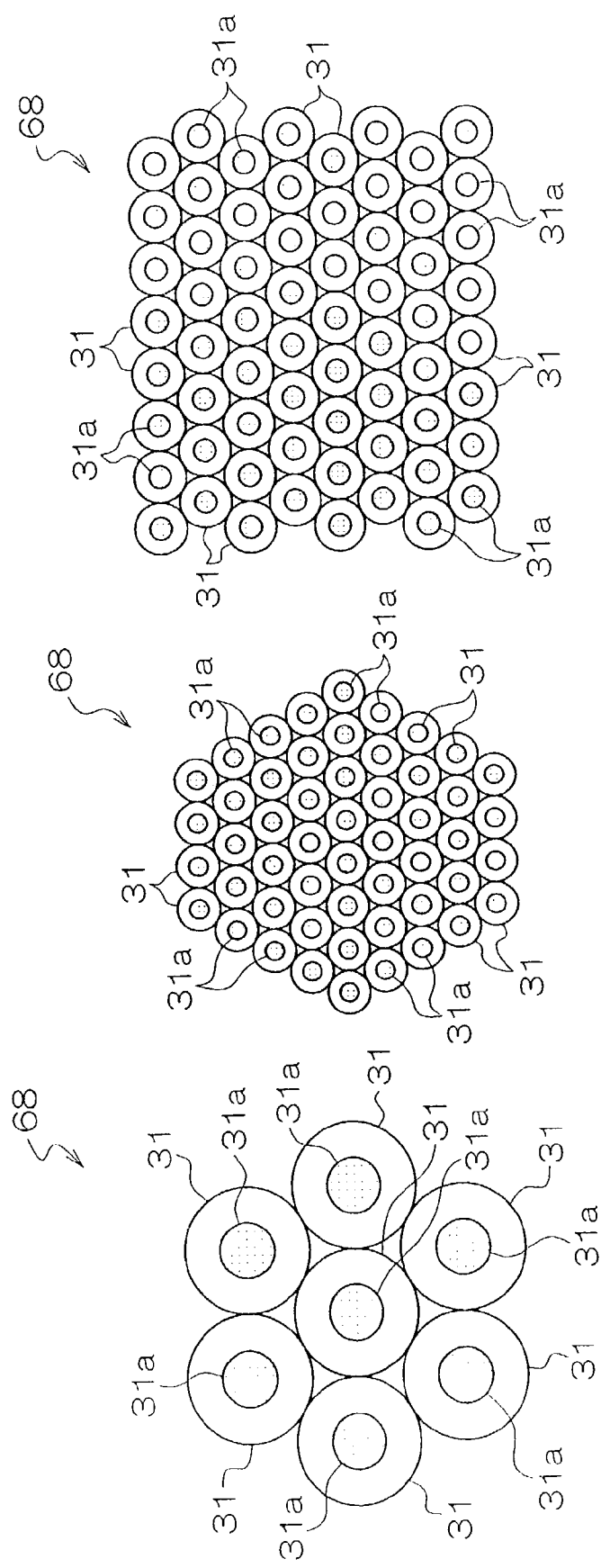
FIGS. 17A, 17B and 17C are plan views showing structural examples of a laser emission portion of the exposure apparatus relating to the first embodiment.
Figure 17B:
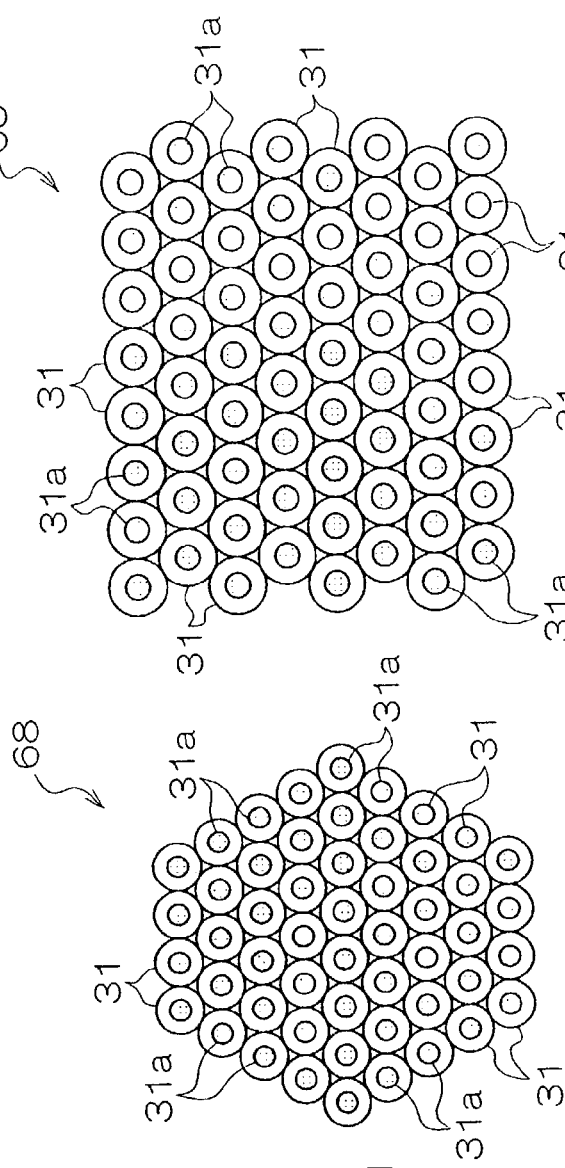
Figure 17C:
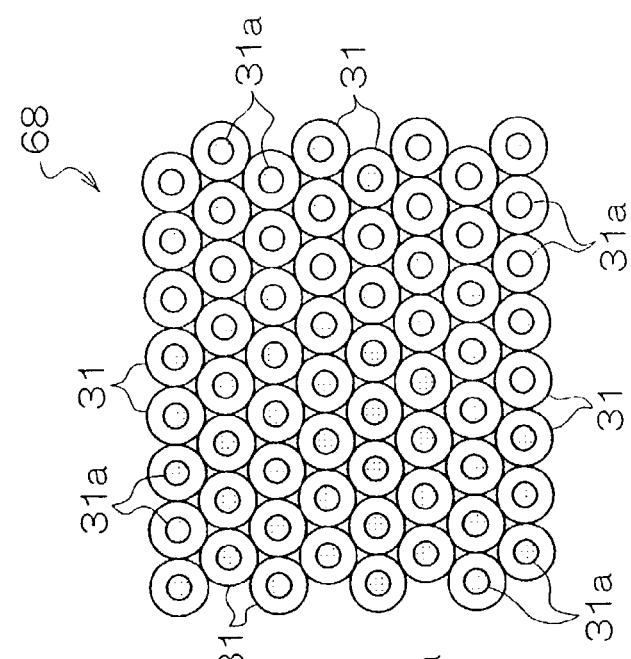

In FIGS. 17A to 17C, structural examples are shown in which pluralities of the optical fibers 31 are bundled to structure laser emission portions in consideration of respective spot shapes of the beam spots BS. For example, in a case in which a circular or hexagonal form is required for the beam spot BS, the laser emission portion 68 can be structured by bundling emission end portions of a plurality (seven) of the optical fibers 31 to a tightly packed hexagon shape, as shown in FIG. 17A. Further, in a case in which the fiber array light source 66 is structured by a large number of the optical fibers 31, the emission end portions of these optical fibers 31 can be bundled to a freely selected form, such as a substantially hexagonal form as shown in FIG. 17B, a substantially rectangular form as shown in FIG. 17C, or the like.

Incidentally, in a case in which the light flux is contracted by the first microlenses 74, the spreading angle of the light flux that has passed through the apertures 78 (the maximum spreading angle $\alpha m$) becomes larger. Here, the focusing depth of the beam spot BS at the surface to be exposed 56 becomes shallower in accordance with the increase in the spreading angle of the light flux transmitted through the apertures 78. Therefore, it is more preferable if the maximum spreading angle of the light flux transmitted through the apertures 78 is smaller.

Figure 18A:
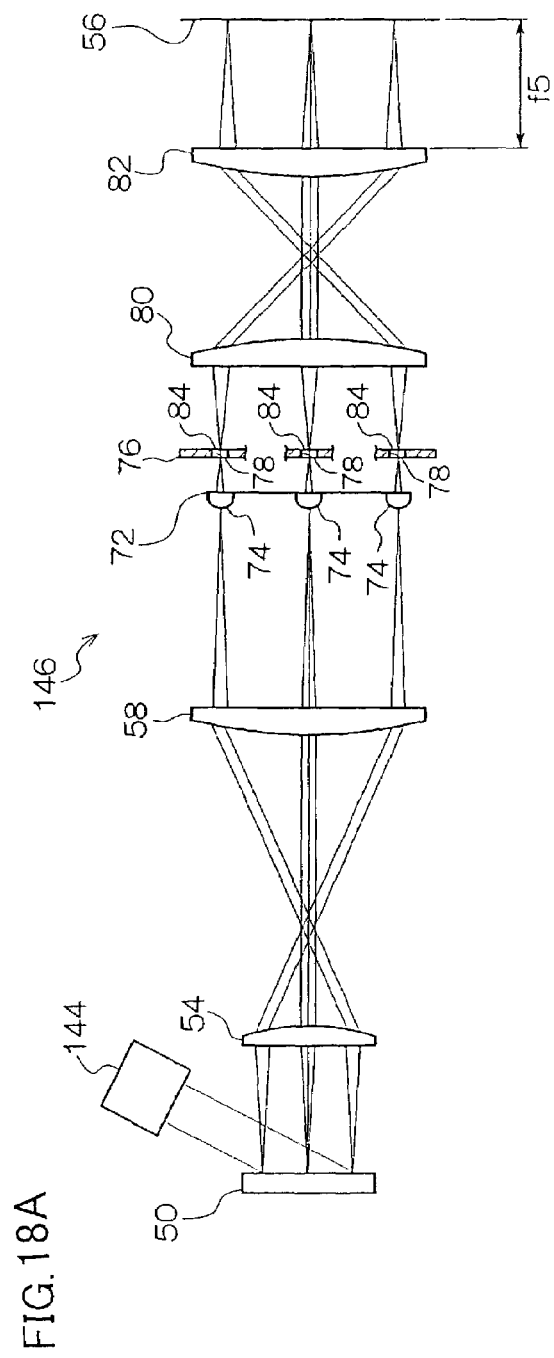
FIGS. 18A and 18B are side views showing a structural example in which a second microlens is disposed at an aperture array of the exposure apparatus relating to the first embodiment.
Figure 18B:
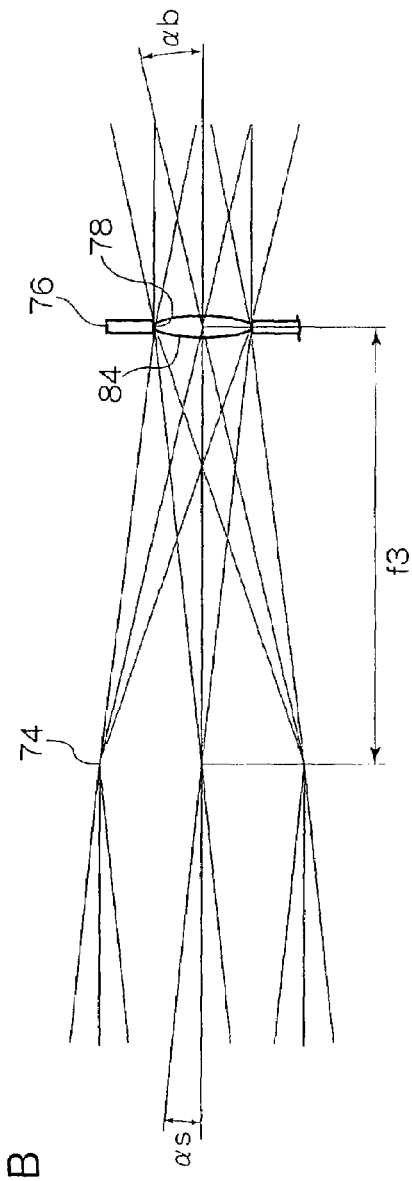

FIGS. 18A and 18B show a structural example in which second microlenses 84 are provided at the aperture array 76 and make the spreading angle of the optical flux that has passed through the apertures 78 smaller. The second microlenses 84 are provided in the respective apertures 78 of the aperture array 76 as shown in FIG. 18B (that is, at a back side focusing position of the first microlenses 74). A lens diameter of the second microlenses 84 corresponds to the opening diameter of the apertures 78 (=2R/n), and a focusing distance f6 of the second microlenses 84 is set to $(R/n)/\alpha s$, the same as the focusing distance f3 of the first microlenses 74.

Because the second microlenses 84 are disposed at the apertures 78 of the aperture array 76, principal optical axes of the respective optical fluxes transmitted through the apertures 78 are parallel to the optical axis, and an increase in the spreading angle of the optical fluxes transmitted through the apertures 78 can be restricted. That is, in a case in which the second microlenses 84 are additionally provided, an amount $\alpha c$ by which the inclination of the optical flux transmitted through the opening edges of the apertures 78 is larger is 0°. Thus, the maximum spreading angle $\alpha m'$ of the optical flux is found by the following equation (5).

$$\alpha m' = \alpha b + \alpha c \quad (5)$$
$$= \alpha b$$
$$= R/f3 = R/\{(R/n)/\alpha s\}$$
$$= n \times \alpha s$$

As is clear from comparison with the maximum spreading angle $α_m$ found by equation (4), in the case in which the second microlenses 84 are disposed at the apertures 78, the maximum spreading angle $α_m'$ is noticeably smaller. Therefore, the focusing depth of the beam spots BS can be made deeper when the light source images are projected on the surface to be exposed 56 as the beam spots BS.

Next, operation of the exposure apparatus described above will be described.

At the exposure heads 166 of the scanner 162, the respective laser beams B1, B2, B3, B4, B5, B6 and B7, which are emitted in divergent forms from the respective GaN-related semiconductor lasers LD1 to LD7 that structure the multiplex laser light source of the fiber array light source 66, are converted to parallel light by the corresponding collimator lenses 11 to 17, as shown in FIG. 11. The laser beams B1 to B7 that have been collimated are focused by the condensing lens 20, and converge at the incidence end face of the core 30a of the multi-mode optical fiber 30.

In the present embodiment, a condensing optical system is structured by the collimator lenses 11 to 17 and the condensing lens 20, and a multiplexing optical system is structured by the condensing optical system and the multi-mode optical fiber 30. Thus, the laser beams B1 to B7 focused by the condensing lens 20 as described above enter the core 30a of the multi-mode optical fiber 30, are propagated in the optical fiber, multiplexed to a single laser beam B, coupled at the emission end portion of the multi-mode optical fiber 30, and emitted from the optical fiber 31.

In each laser module 64, a coupling efficiency of the laser beams B1 to B7 into the multi-mode optical fiber 30 is 0.85. Therefore, in a case in which the respective outputs of the GaN-related semiconductor lasers LD1 to LD7 are 30 mW, the multiplexed laser beam B can be obtained with an output of 180 mW (=30 mW×0.85×7) from each of the optical fibers 31 arranged in an array pattern as shown in FIG. 9. Accordingly, output of the laser emission portion 68 in which six of the optical fibers 31 are arranged in the array pattern is approximately 1 W (=180 mW×6).

In, for example, a conventional fiber light source in which semiconductor lasers are focused at optical fibers in a one-to-one relationship, lasers with outputs of around 30 mW (milliwatts) are commonly employed as the semiconductor lasers, and optical fibers with core diameter 50 μm, cladding diameter 125 μm, and NA (aperture number) 0.2 are employed as the multi-mode optical fibers. Therefore, if an output of around 1 W (watt) is to be obtained, forty-eight (8×6) multi-mode optical fibers must be bundled. Thus, from a light emission region with an area of 0.62 mm$^2$ (0.675 mm by 0.925 mm), luminance of this laser emission portion 68 is $1.6×10^6$ W/m$^2$, and luminance from each optical fiber is $3.2×10^6$ W/m$^2$.

In contrast, in the present embodiment, an output of approximately 1 W can be provided by six multi-mode optical fibers, as described above. Thus, from a light emission region of the laser emission portion 68 with an area of 0.0081 mm$^2$ (0.325 mm×0.025 mm), luminance of the laser emission portion 68 is $123×10^6$ W/m$^2$. Therefore, a luminance about eighty times higher than in the conventional case can be expected. Furthermore, the luminance from each optical fiber is $90×10^6$ W/m$^2$. Thus, a luminance around twenty-eight times higher than in the conventional case can be expected. Consequently, the angle of optical flux that is incident on the DMD 50 is made smaller, and as a result the angle of optical flux that is incident on the surface to be exposed 56 is made smaller. Therefore, the focusing depth of the beam spots can be made deeper.

Image data corresponding to an exposure pattern is inputted at the unillustrated controller connected to the DMD 50, and is temporarily stored in a frame memory in the controller. This image data is data which represents a density of each pixel structuring an image with a binary value (whether or not a dot is to be recorded).

The stage 152, at which the surface of the photosensitive material 150 is adsorbed, is moved along the guides 158 at a constant speed by the driving apparatus, from an upstream side of the gate 160 to a downstream side thereof. When the stage 152 is passing under the gate 160, and the leading end of the photosensitive material 150 has been detected by the detection sensors 164 attached at the gate 160, the image data stored in the frame memory is read out in sequence as a plurality of line portion units, and control signals for each of the exposure heads 166 are generated on the basis of the image data read from the data processing section. Hence, the micromirrors of the DMDs 50 at the respective exposure heads 166 are respectively switched on and off by the mirror driving control section on the basis of the control signals that have been generated.

When laser light is irradiated from the fiber array light source 66 to the DMD 50, if a micromirror of the DMD 50 is in the ON state, the reflected laser light is focused on the surface to be exposed 56 of the photosensitive material 150 by the lens systems 54 and 58. Thus, the laser light emitted from the fiber array light source 66 is turned on or off at each pixel, and the photosensitive material 150 is exposed in a unit (the exposure area 168) with a number of pixels substantially the same as the number of pixels employed at the DMD 50. As the photosensitive material 150 is moved together with the stage 152 at the constant speed, the photosensitive material 150 is scanned in a direction opposite to the stage movement direction by the scanner 162, and the strip-form exposed regions 170 are formed at the respective exposure heads 166.

When scanning of the photosensitive material 150 by the scanner 162 has been completed and the trailing end of the photosensitive material 150 has been detected by the detection sensors 164, the stage 152 is driven back along the guides 158 by the unillustrated driving apparatus, to a start point at an upstream-most side of the gate 160, and is again moved along the guides 158, at a constant speed, from the upstream side to the downstream side of the gate 160.

In the exposure apparatus 142 described above, the first microlenses 74 are two-dimensionally arranged to correspond one-to-one with the micromirrors 62 at the DMD 50, and the first microlenses 74 are supported on optical paths of the laser beams that are modulated to the exposing state by the micromirrors 62. The light source images that are formed at the back side focusing position of the first microlenses 74 are projected on the surface to be exposed 56, and these light source images serve as the beam spots BS and expose the surface to be exposed 56. Thus, the beam diameters of the laser beams that have been modulated to the exposing state by the micromirrors 62 of the DMD 50 can be provided by the first microlenses 74. Therefore, even if the area of the exposure area 168 due to the lens systems 54 and 58 is magnified relative to the surface portion of the DMD 50, contraction of the beam diameters of the beam spots BS projected at the surface to be exposed 56 is possible, and a fall in the MTF characteristic at the exposure area 168 can be prevented.

Further, with the exposure apparatus 142, the light source images of the laser emission portion 68 are projected onto the surface to be exposed 56, and these light source images serve as the beam spots BS and expose the surface to be exposed 56. Hence, light amount distributions at central portions of the beam spots can be prevented from falling due to the effects of the non-reflective portions 62A of the micromirrors 62 at the DMD 50, and the surface to be exposed 56 can be exposed by beam spots BS having uniform light amount distributions.

Now, with the projecting optical system 146 described above, the lens systems 54 and 58 structuring the magnifying optical system and the lens systems 80 and 82 structuring the unit magnification optical system are respectively utilized for adjusting the distance from the DMD 50 to the position at which the beam spots BS are formed. However, in a case in which the distance from the DMD 50 to the surface to be exposed 56 is short, the lens systems 80 and 82 may be omitted, as shown in FIG. 20A, and the light source images of the laser emission portion 68 that have been contracted by the first microlenses 74 may directly serve as the beam spots BS for exposing the surface to be exposed 56. In such a case, with the exposure apparatus 142, the position of the surface to be exposed 56 is adjusted to be positioned at a vicinity of the back side focusing position of the microlens array 72.

Figure 19A:
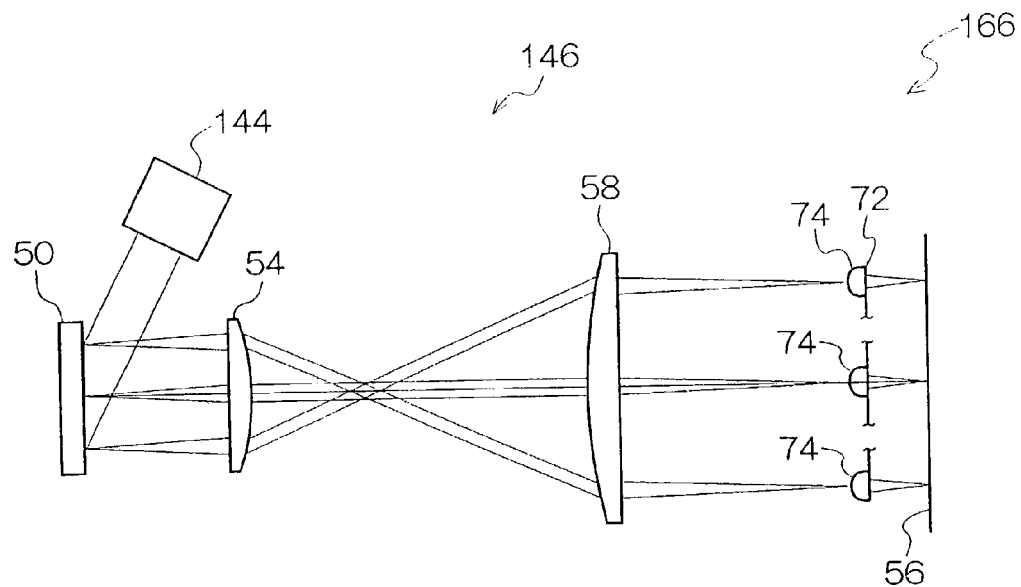
FIG. 19A is a side view showing structure of a variant example of an exposure head relating to an embodiment of the present invention.
Figure 19B:
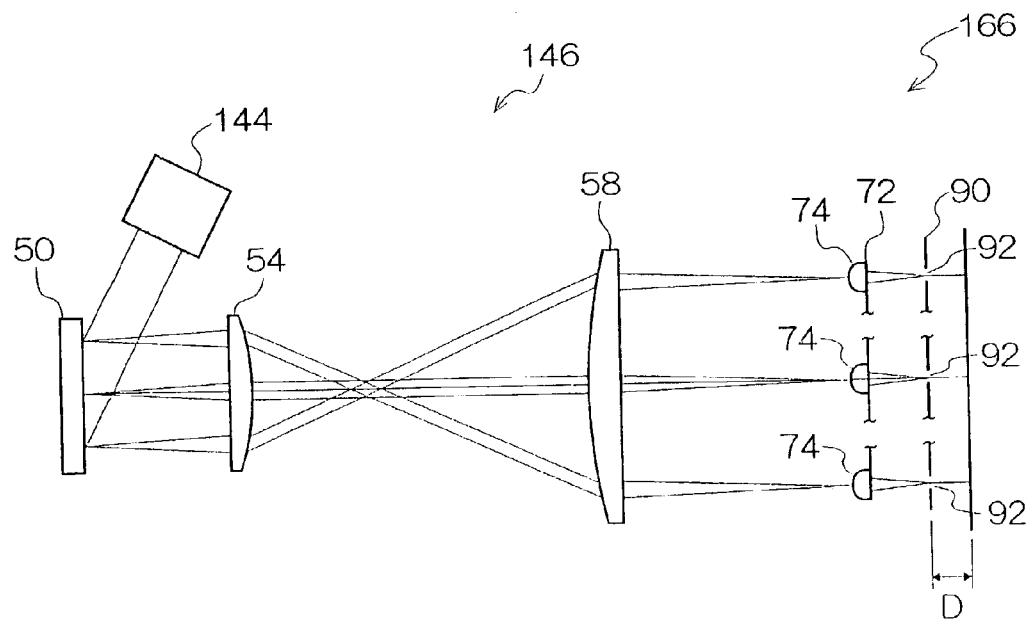
FIG. 19B is a side view showing structure of another variant example of the exposure head relating to the embodiment of the present invention.

However, in a case in which the light source images formed by the microlens array 72 serve directly as the beam spots BS as shown in FIG. 19A, formation of the outline shapes of the beam spots BS, and shading of noise component light, such as diffracted light, flair light and the like, are not possible. In order to solve such problems, disposing an aperture array 90 at a vicinity of the back side focusing position of the microlens array 72 and adjusting the position of the surface to be exposed 56 to a position separated from the aperture array 90 by a predetermined distance, as shown in FIG. 19B, can be considered. At this aperture array 90, a plurality of apertures 92 are provided so as to be properly positioned at the first microlenses 74 of the microlens array 72. The opening diameters and opening shapes of the apertures 92 are suitably specified in accordance with the spot diameters and spot shapes of the beam spots BS that are required at the surface to be exposed 56.

Here, a distance D between the aperture array 90 and the surface to be exposed 56, when diffraction of light that is transmitted through the apertures 92 is considered, is in an optimal separation range according to the wavelength of the laser light and an opening diameter of the apertures 92. For example, if the wavelength of the laser light is 405 nm and the opening diameter of the apertures 92 is 13 μm, the separation D will generally be set to within a range of 50 to 200 μm.

Figure 20:
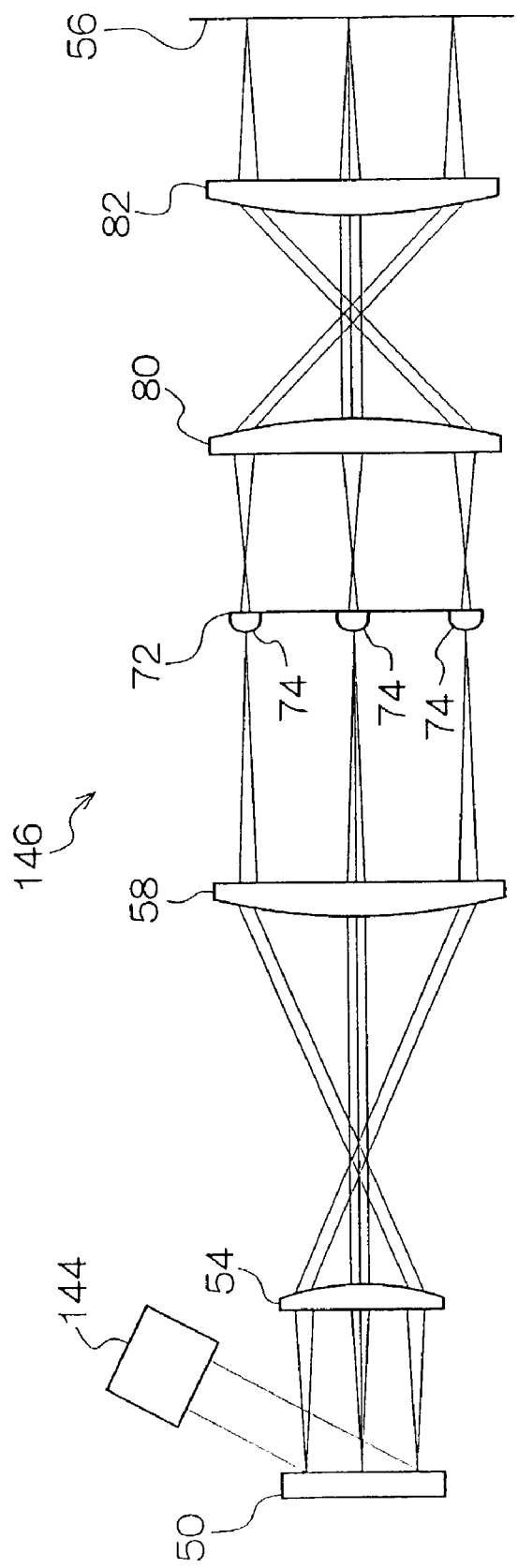
FIG. 20 is a side view showing structure of the exposure head shown in FIG. 5A, in a case in which the aperture array is omitted from the projecting optical system.

The aperture array 76 may be omitted from the projecting optical system 146, as shown in FIG. 20, in a case in which the outline shape of the beam spot BS and noise components such as diffraction light, flair light and the like are not particularly problematic, because of characteristics of the photosensitive material 150 and the like. In such a case too, a decrease in the MTF characteristic at the exposure area 168 can be avoided, and a basic effect that the light amount distribution of the beam spot BS can be made uniform is assured.

For the exposure apparatus 142 relating to the present embodiment, a DMD is utilized as the spatial modulation element. However, for example, MEMS (microelectro-mechanical systems) type spatial modulation elements (SLM: spatial light modulators), optical elements (PLZT elements), liquid crystal shutters (FLC) and the like, which modulate transmitted light by electro-optical effects, and spatial modulation elements other than MEMS types may be utilized instead of the DMD 50. In these cases too, if a structure shown in FIG. 5 or FIG. 19 is used as the projecting optical system 146, light amount losses due to the apertures 78 are restricted and a decrease in the MTF characteristic at the exposure area 168 can be prevented.

Herein, MEMS is a general term for Microsystems in which micro-size sensors, actuators and control circuits are integrated by micro-machining technology based on IC fabrication processes. MEMS type spatial modulation elements means spatial modulation elements which are driven by electromechanical operations by utilization of static electric forces.

As described above, according to an exposure head and exposure apparatus of the present invention, a reduction in efficiency of usage of a laser beam emitted from a laser emission portion at illumination means is limited, and an exposure surface is exposed by a beam spot with a desired spot diameter and spot shape.

Second Embodiment

Herebelow, an exposure apparatus relating to a second embodiment of the present invention will be briefly described. In particular, portions that are different from the first embodiment described above will be detailed.

In the second embodiment, instead of the projecting optical system 146, an imaging optical system 146A is used.

At the microfieldlens array 72, the plurality of first microlenses 74 are integrally formed in a one-to-one correspondence with the micromirrors 62 of the DMD 50 which reflect the light from the illumination unit 144. The first microlenses 74 are disposed at imaging surfaces of the micromirrors 62 on the optical axes of the laser beams which have been transmitted through the lens systems 54 and 58. The diameters of the first microlenses 74 are substantially the same as image sizes of real images of the micromirrors 62. At the microfieldlens array 72, the first microlenses 74 are arranged in two dimensions at a pitch the same as the size of the images of the micromirrors 62 at the imaging position.

At the microimaging lens array 76, the plurality of apertures (open diaphragms) 78 are provided in a one-to-one correspondence with the plurality of first microlenses 74 at the microfieldlens array 72, and second microlenses 79 are disposed in the respective openings of the apertures 78. A lens diameter of the second microlenses 79 is the same as the opening diameter of the apertures 78, and optical axes of the second microlenses 79 and optical axes of the first microlenses 74 coincide with one another.

At the imaging optical system 146A, the focusing distance of the lens system 54 is f1 and the focusing distance of the lens system 58 is f2. The focusing distance of the first microlenses 74 is f3, and a focusing distance of the second microlenses 79 is f4. The microimaging lens array 72 is disposed at the back side focusing position of the first microlenses 74. The lens systems 80 and 82 are structured to serve as, for example, a unit magnification optical system. The lens systems 80 and 82 focus a real image group on the surface to be exposed 56. The real image group is a collection of real images of the micromirrors 62, which are respectively focused by the plurality of second micromirrors 79. A focusing distance of the lens system 80 and the lens system 82 is f5. Note that although the lens systems 54, 58, 80 and 82 of the imaging optical system 146A are each shown as a single lens in FIG. 5, each may be a lens system in which a plurality of lenses (for example, a convex loans and a concave lens) are combined.

With the imaging optical system 146A, the spot diameter and spot shape of beam spots imaged at the surface to be exposed 56 are determined in accordance with design factors such as the resolution of an exposure pattern formed at the exposed region 170, the scanning speed of the exposure head 166, the magnitude of the inclination angle of the DMD 50 with respect to the scanning direction, characteristics of the photosensitive material 150, and the like. Moreover, aperture diameters and aperture shapes of the apertures 78 are specified in accordance with the spot diameter and spot shape of the beam spots to be imaged at the surface to be exposed 56.

Figure 21A:
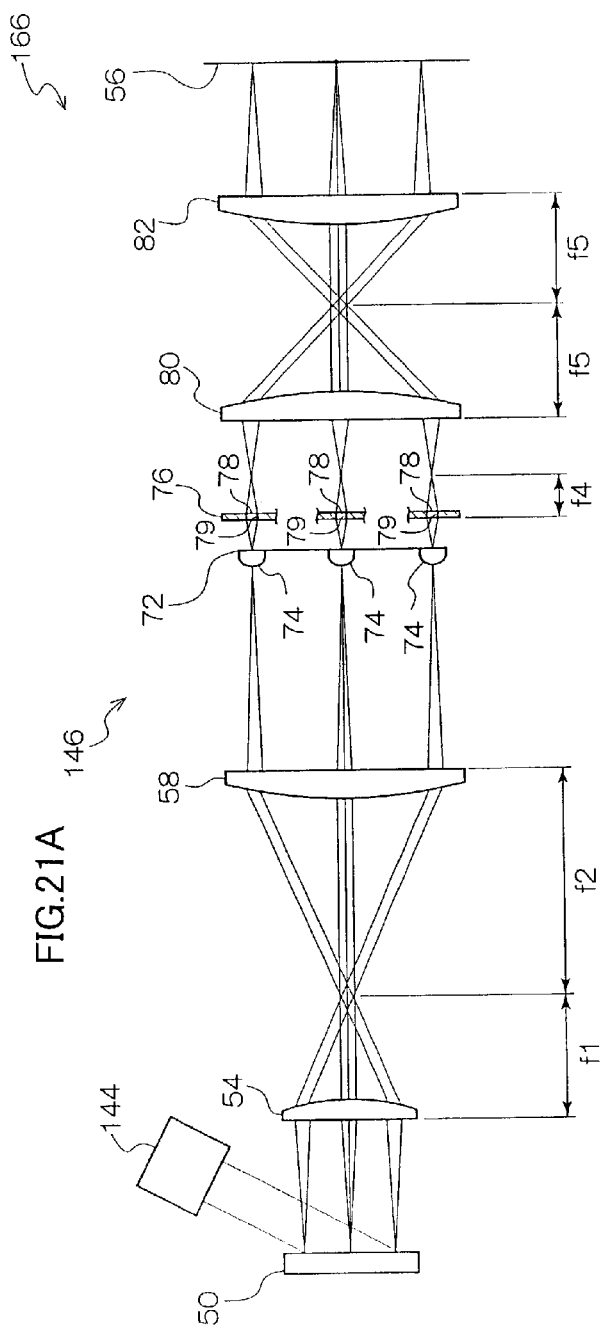
FIG. 21A is a side view showing structure of an exposure head of an exposure apparatus relating to a second embodiment.
Figure 21C:
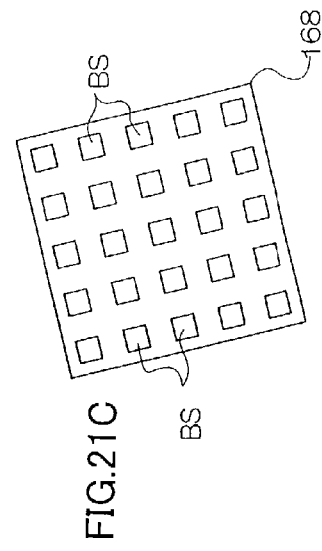
FIGS. 21B and 21C are plan views of exposure areas due to the exposure head.
Figure 21B:
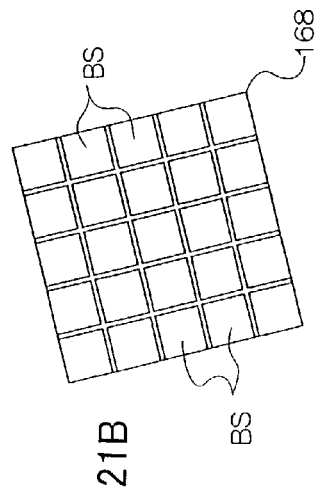

Operation of the first microlenses 74 and second microlenses 79 at the imaging optical system 146A will be described with reference to FIGS. 21A to 21C. The lens systems 54 and 58 structuring the enlarging optical system enlarge the cross-sectional area of the optical flux that has been reflected by the DMD 50. Thus, the area of the exposure area 168 at the surface to be exposed 56 is enlarged to the desired size. Here, because the laser beams that have been reflected by the micromirrors 62 of the DMD 50 pass through the lens systems 54 and 58, the beam diameters thereof are enlarged in accordance with the magnification ratio of the lens systems 54 and 58. Therefore, if the first microlenses 74 and second microlenses 79 were not disposed in the imaging optical system 146A, then, as shown in FIG. 21B, the spot diameter of each beam spot BS projected at the surface to be exposed 56 would be large in accordance with the size of the exposure area 168. Accordingly, even with scanning exposure as shown in FIG. 8A, the MTF (modulation transfer function) characteristic of the exposure area 168 would be reduced in accordance with the magnification ratio of the lens systems 54 and 58.

Figure 22A:
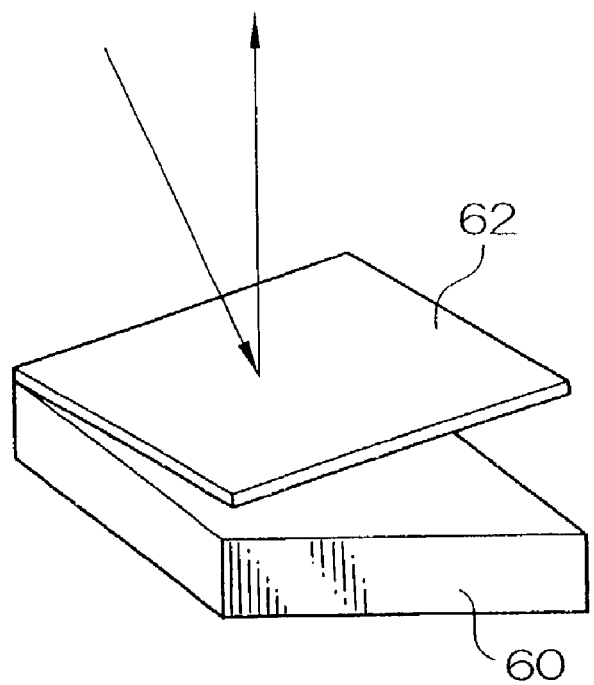
FIGS. 22A and 22B are explanatory views for explaining operation of a DMD.
Figure 22B:
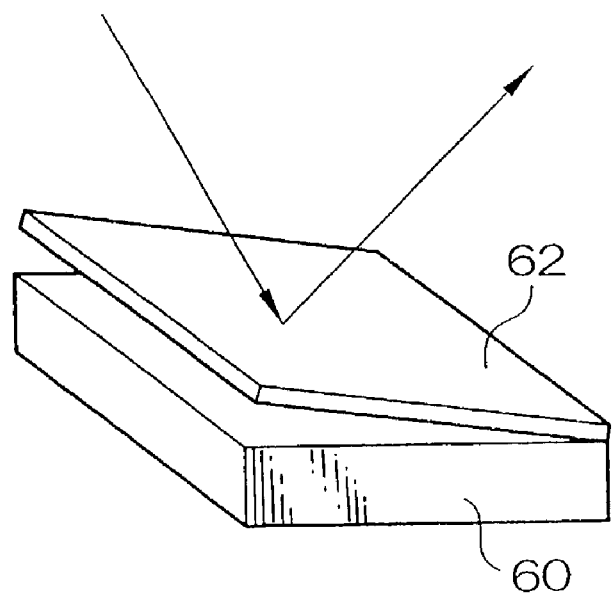

To prevent the MTF characteristic from falling as described above and to prevent a portion of the laser beams that are modulated to the exposing state by the micromirrors 62 from becoming stray light, in this imaging optical system 146A, the plurality of first microlenses 74 at an imaging surface at which real images of the micromirrors 62 are formed by the lens systems 54 and 58 are disposed in a two dimensional manner so as to correspond one-to-one with the micromirrors 62 of the DMD 50, and the plurality of second microlenses 79 are disposed in a two dimensional manner at the respective back side focusing positions of the first microlenses 74. In this embodiment, each micromirror 62 has no hole-form non-reflective portion, as shown in FIGS. 22A and 22B.

Figure 23:
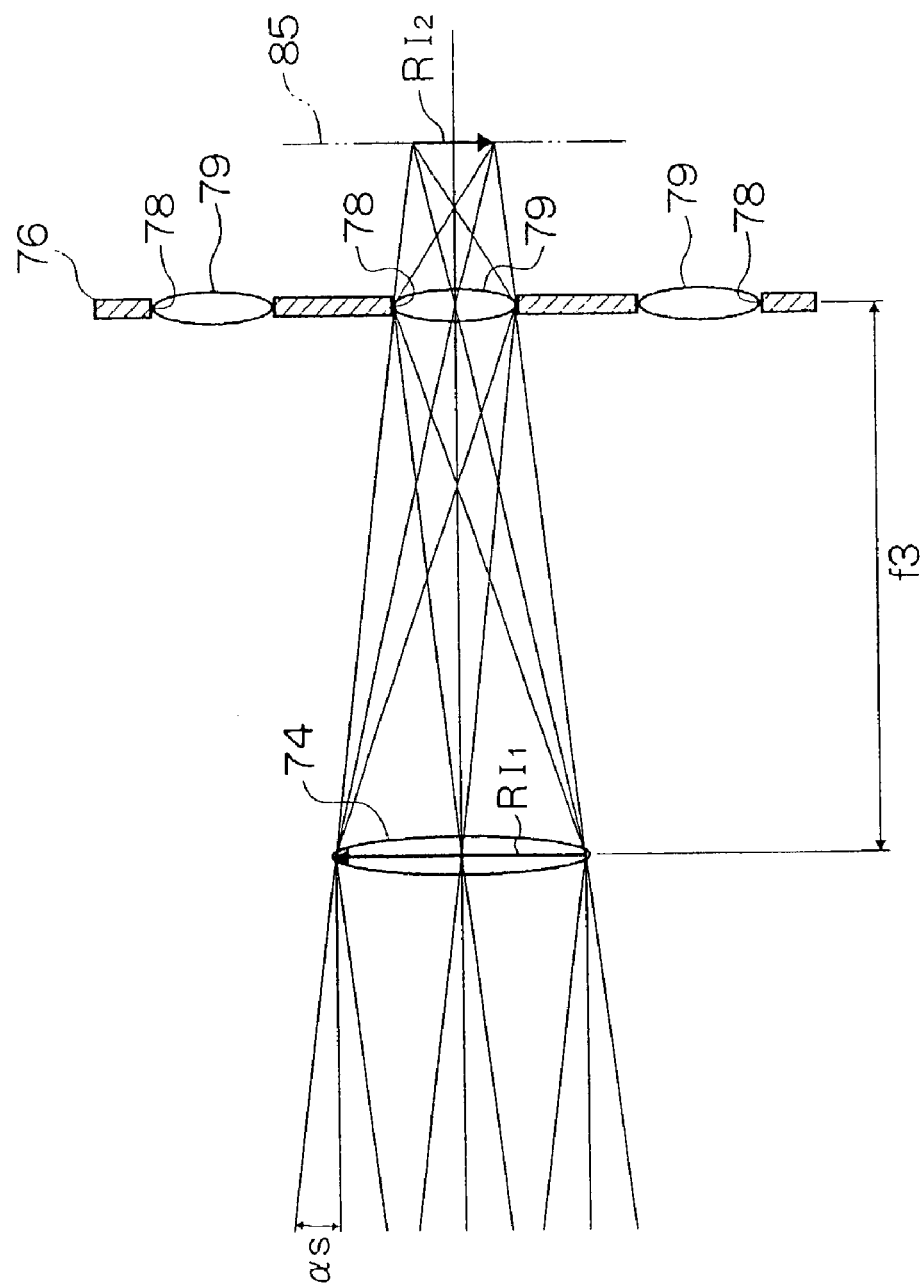
FIG. 23 is a side view of a first microlens and second microlens of the exposure head shown in FIG. 21A, and shows a structural example in which an opening diameter of the second microlens is smaller than an opening diameter of the first microlens.

Here, as shown in FIG. 23, the second microlens 79 shrinks the real image $RI_1$ of the micromirror 62 and forms a real image $RI_2$ on an imaging surface 85, which is an imaginary surface equivalent to the surface to be exposed 56. Consequently, as shown in FIG. 21C, even if the exposure area 168 is enlarged to a high magnification by the lens systems 54 and 58, the spot diameters of the beam spots BS are contracted to the required size and the reduction in the MTF characteristic at the surface to be exposed 56 can be avoided. Further, the first microlenses 74 operate as field lenses for focusing the laser beams. The first microlenses 74 focus the individual laser beams, which have a spreading angle αs in accordance with the area of the laser emission portion 68 along the directions intersecting the optical axis thereof, and feed the laser beams into the individual second microlenses 79.

Next, a method for specifying the focusing distance f3 of the first microlenses 74 will be specifically described. As shown in FIG. 23, the opening diameter 2R of the first microlenses 74 is the same as the size of the real image $RI_1$ of the micromirror 62 that has been focused by the lens system 58. The opening diameter of the second microlens 79, which is disposed at the back side focusing position of the first microlens 74, is set to 2R/n. Here, n is a contraction ratio of the opening diameter of the second microlens 79 relative to the opening diameter of the first microlens 74. This value n (n 1) is determined on the basis of the spot diameter of the beam spot BS.

The theoretical condition in which all of the optical flux that is transmitted through the first microlens 74 is incident on the second microlens 79, that is, the aperture 78, is considered. Here, if the spreading angle of the optical flux from the first microlens 74 toward the light source side is αs, this spreading angle αs is found by the previously mentioned equation (1).

If the focusing distance f3 of the first microlens 74 is specified to the value calculated by the aforementioned equation (2), then, as shown in FIG. 23, light that has passed through the first microlens 74 is, theoretically, not blocked by the aperture 78, and the whole amount is inputted to the single second microlens 79. However, the light transmitted through the first microlens 74 will include light that becomes noise components, such as diffracted light due to aberration of the first microlens 74, scattered light due to light-scattering and the like, and the light of such noise components will be shaded by the aperture 78. Hence, in practice, a small light amount loss occurs because of the aperture 78. Further, the focusing distance f3 obtained by equation (2) is a theoretical optimal value for minimizing light amount losses. Thus, at the exposure head 166, disposing the apertures 78 and the second microlenses 79 at a slight separation forward or rearward from the back side focusing position of the first microlenses 74 is allowable, with due consideration for the ability of the apertures 78 to form the beam spots BS, losses due to noise light, and the like.

Figure 24:
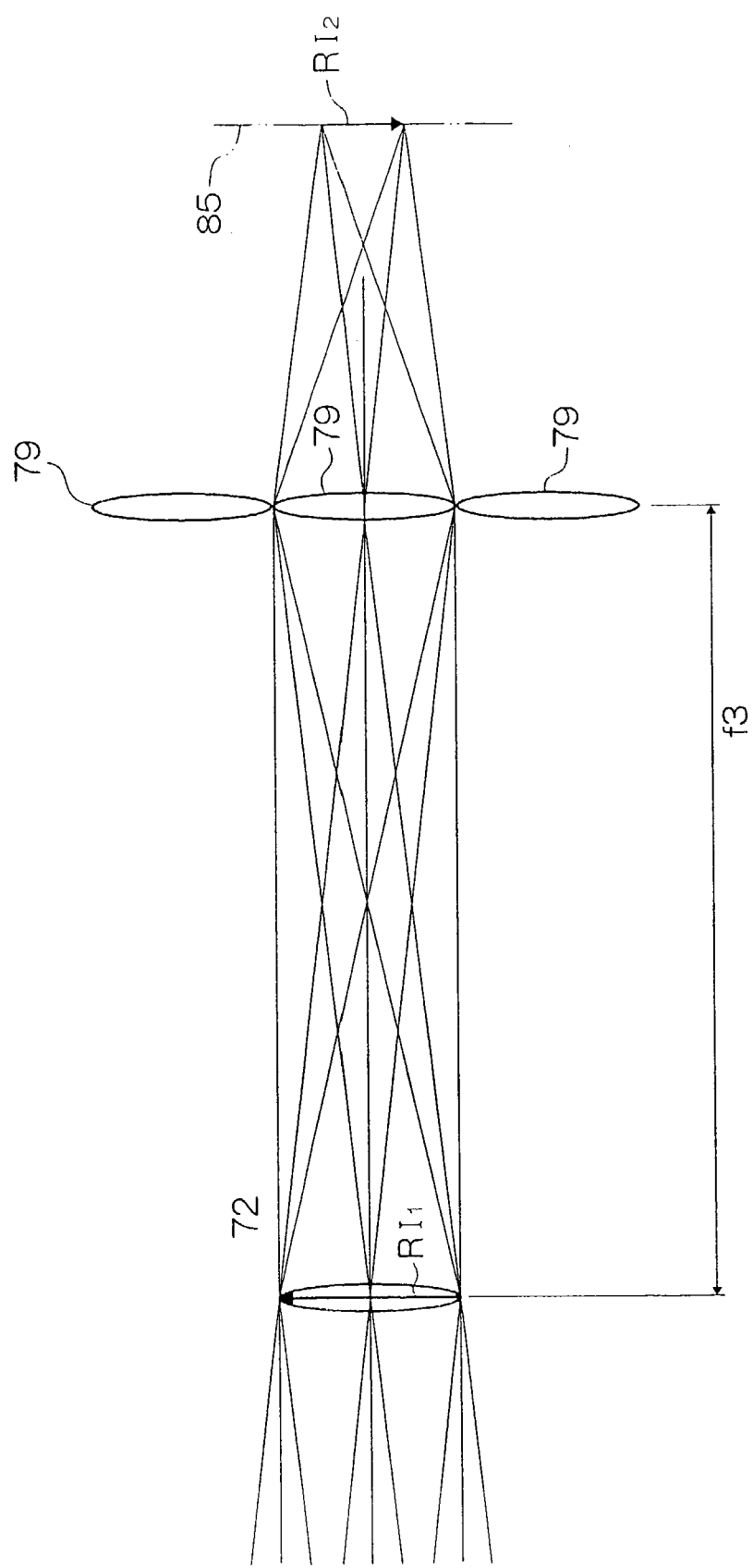
FIG. 24 is a side view of the first microlens and second microlens of the exposure head shown in FIG. 21A, and shows a structural example in which the opening diameters of the first microlens and the second microlens are equal.

FIG. 24 shows a particular case in which the contraction ratio n is set to 1 and the opening diameter of the second microlenses 79 and the opening diameter 2R of the first microlenses 74 are equal.

Here, the imaging surface 85 is mutually conjugative with the surface to be exposed 56 via the lens systems 80 and 82. Therefore, real images of the micromirrors 62, which have the same size as the real images $RI_2$ of the micromirrors 62 that have been contracted by the second microlenses 79, are focused at the surface to be exposed 56. With the exposure apparatus 142, the real images of the micromirrors 62, which are focused by the lens systems 80 and 82, serve as the beam spots BS and expose the surface to be exposed 56.

With the exposure apparatus 142 described above, the plurality of first microlenses 74 focuses the laser beams that are modulated to the exposing state by the micromirrors 62 at the DMD 50, and the plurality of second microlenses 79, which are disposed at the back side focusing positions of the first microlenses 74, respectively focus the real images of the micromirrors on the surface to be exposed. Thus, the laser beams that are modulated to the exposing state can be focused by the first microlenses 74, and these focused laser beams can be inputted to the second microlenses 79. Therefore, even though the laser beams modulated to the exposing state have a spreading angle corresponding to the area of the laser emission portion 68, a portion of a laser beam that is modulated to the exposing state by any predetermined micromirror 62 can be prevented from entering the second microlenses 79 other than the second microlens 79 that corresponds to that predetermined micromirror 62 as stray light.

With the exposure apparatus 142, because the focusing distance of the second microlenses 79 is suitably set in accordance with the spot diameter of the beam spots BS, the size of the real images of the micromirrors 62, which are formed as beam spots BS on the surface to be exposed 56, can be reduced to a freely selected size. Therefore, even though the area of the exposure area 168 is magnified by the lens systems 54 and 58, a reduction in the MTF characteristic at the surface to be exposed 56 can be prevented.

In the exposure apparatus 142 of the present embodiment, the first microlenses 74 and the second microlenses 79 are respectively structured by individual lenses. However, one or both of the first microlenses 74 and the second microlenses 79 may be respectively structured with a plurality of combinations of lenses (microlenses). When the first microlenses 74 or second microlenses 79 are provided by combining lenses (microlenses) thus, chromatic aberrations, spherical aberrations and the like can be effectively rectified.

Figure 25:
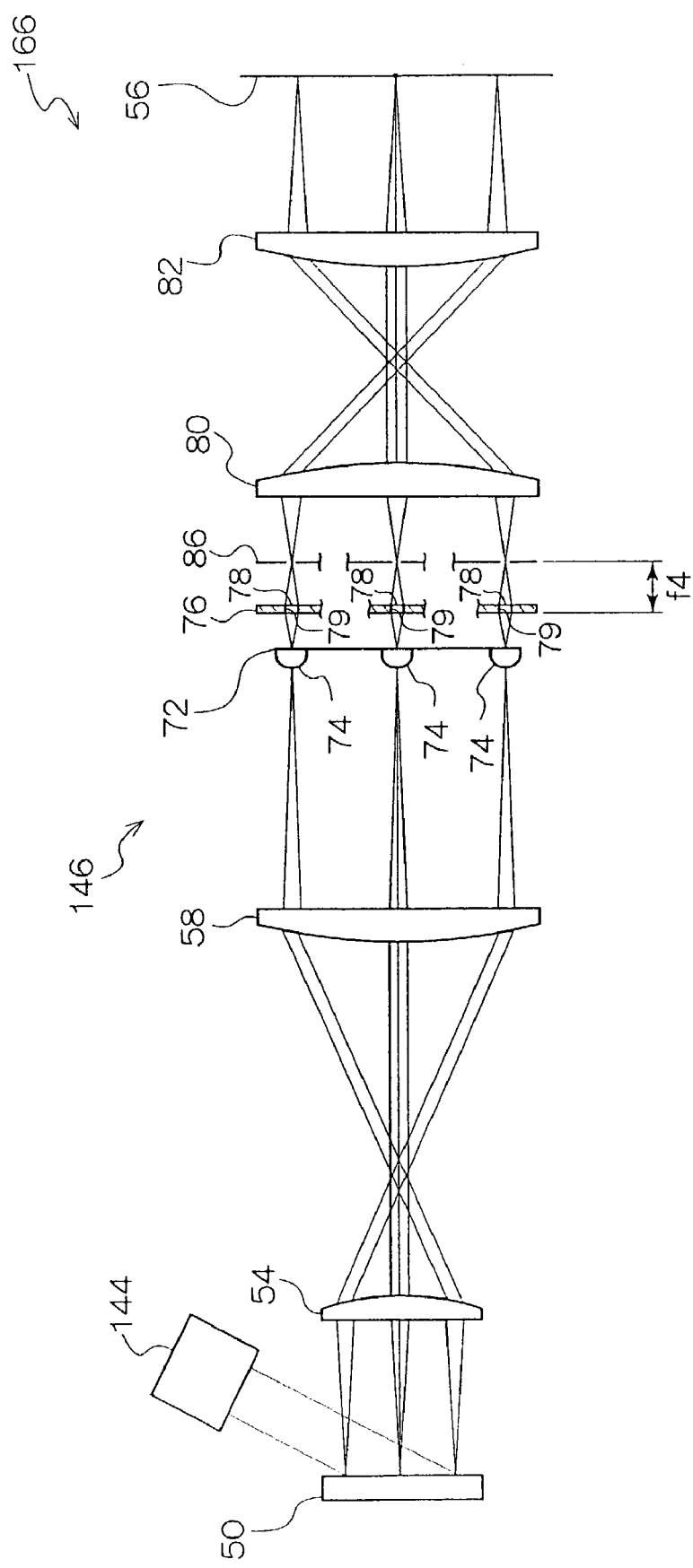
FIG. 25 is a side view showing structure of the exposure head shown in FIG. 21A, in a case in which apertures are additionally provided at back side focusing positions of the second microlenses.
Figure 26:
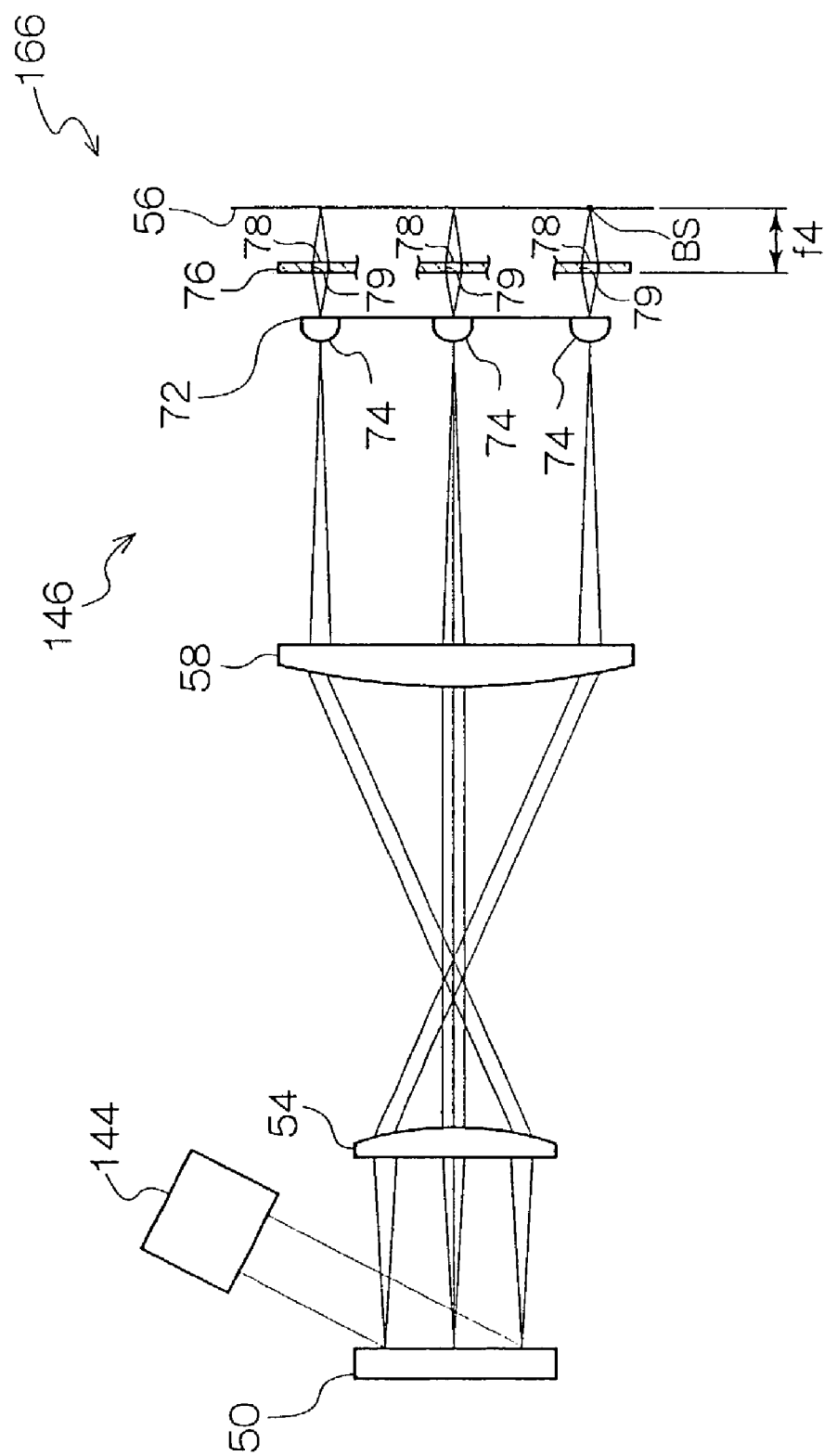
FIG. 26 is a side view showing a structure in which second lens systems are omitted from the imaging optical system shown in FIG. 21A.
Figure 27:
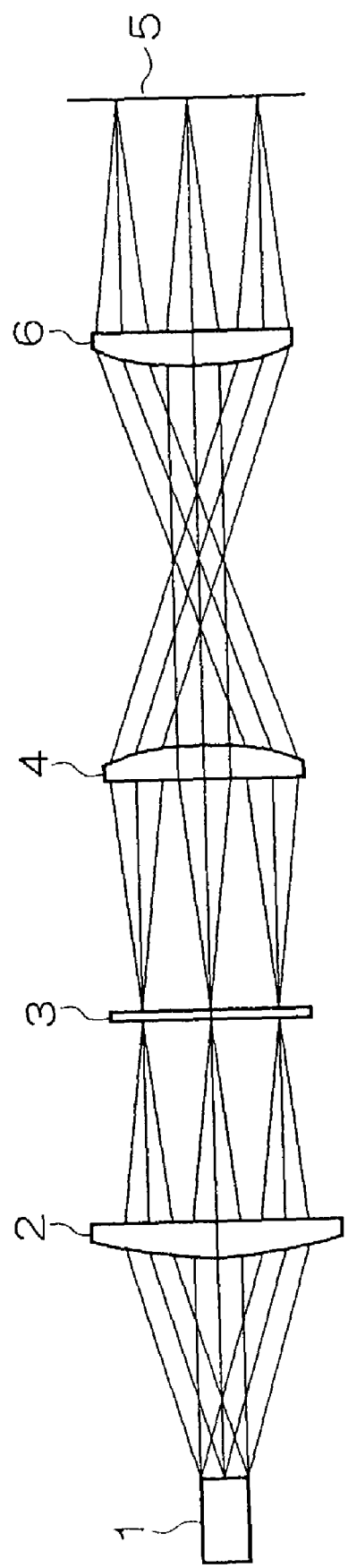
FIG. 27 is a side view, along an optical axis, showing structure of a conventional exposure head.
Figure 28:
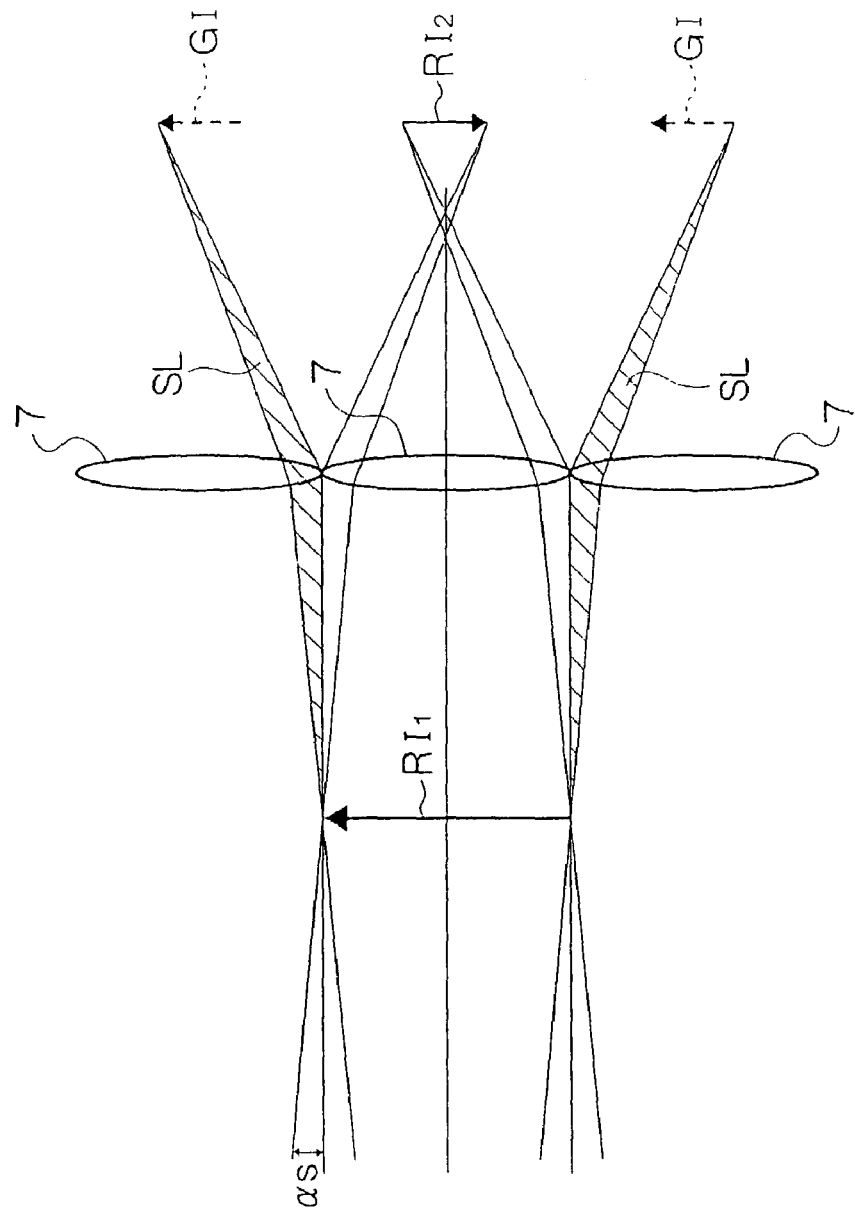
FIG. 28 is a side view showing a structure in which a microlens is employed at a conventional exposure head.

Furthermore, as shown in FIG. 25, an aperture array 86, which is provided with apertures 88 corresponding to the spot diameter and spot shape of the beam spots BS at the surface to be exposed 56 may be disposed at a vicinity of the back side focusing position of the second microlenses 79. Because the apertures 88 which have opening diameters and opening shapes corresponding to the beam diameter and beam shape of the beam spots BS at the surface to be exposed 56 are disposed at the second microlenses 79 back side focusing position vicinity, light of the laser beams emitted from the second microlenses 79 which becomes noise components, such as scattered light, diffracted light and the like, can be shaded. Therefore, the beam spots BS projected at the surface to be exposed 56 can be accurately formed to the required spot shape, and projection of noise component light outside the beam spots BS can be prevented.

Further still, in a case in which a clearance between the exposure heads 166 and the surface to be exposed 56 is sufficiently small, the lens systems 80 and 82 (second optical system) may be omitted from the projecting optical system 146, as shown in FIG. Y. The real images of the micromirrors 62 of the DMD 50, which are focused by the second microlenses 79 of the aperture array 76, may directly serve as the beam spots BS, being projected on the surface to be exposed 56 so as to expose the photosensitive material 150.

What is claimed is:

1. An exposure head comprising:
   a light source unit including a plurality of laser emission portions which emit laser beams;
   a spatial modulation element for modulating the laser beams, including a plurality of pixel portions which change light modulation states in accordance with respective control signals, the pixel portions being arranged in a two-dimensional pattern on a predetermined support;
   a first optical system for focusing images of the pixel portions of the spatial modulation element; and
   a plurality of first microlenses arranged in a two-dimensional pattern so as to correspond to the pixel portions, the first microlenses being respectively supported at respective focusing positions of the pixel portions,
   wherein light source images of the laser emission portions, which are formed at back side focusing positions of the first microlenses, are projected to a surface that is to be exposed, and the light source images serve as beam spots for exposing the surface that is to be exposed.

2. The exposure head of claim 1, further comprising a second optical system for focusing a light source image group, which includes a collection of light source images focused by the first microlenses, on the surface that is to be exposed.

3. The exposure head of claim 1, wherein the spatial modulation element comprises a micromirror device, and the pixel portions include micromirrors.

4. The exposure head of claim 1, wherein the pixel portions of the spatial modulation element modulate the laser beams from the laser emission portions into either of an exposing state and a non-exposing state.

5. The exposure head of claim 1, further comprising apertures disposed at vicinities of the back side focusing positions of the first microlenses, the apertures including opening diameters and opening shapes which correspond to spot diameters and spot shapes of the beam spots at the surface that is to be exposed.

6. The exposure head of claim 1, further comprising second microlenses disposed at the back side focusing positions of the first microlenses, the second microlenses including positive lens powers.

7. The exposure head of claim 1, wherein outline shapes of the laser emission portions along directions intersecting optical axes thereof correspond to shapes of the beam spots at the surface that is to be exposed.

8. An exposure apparatus comprising the exposure head of claim 1.

9. The exposure apparatus of claim 8, wherein the exposure head is supported such that a direction of arrangement of the pixel portions is inclined with respect to a direction of scanning of the surface that is to be exposed.

10. The exposure apparatus of claim 8, further comprising a movement apparatus which relatively moves the exposure head in a direction of scanning at a time of exposure of the surface that is to be exposed.

11. The exposure head of claim 1, wherein the first microlenses and the pixel portions form a 1:1 correspondence.

12. The exposure head of claim 1, wherein the first optical system has back-side telecentricity.

13. An exposure head comprising:
   a light source unit including a plurality of laser emission portions which emit laser beams;
   a spatial modulation element for modulating the laser beams, including a plurality of pixel portions which change light modulation states in accordance with respective control signals, the pixel portions being arranged in a two-dimensional pattern on a predetermined support;
   a first optical system for focusing images of the pixel portions of the spatial modulation element;
   a plurality of first microlenses for focusing the laser beams, the first microlenses being two-dimensionally arranged at focusing positions of the plurality of pixel portions, at a pitch which is substantially the same as a size of images that are formed at the focusing positions; and
   a plurality of second microlenses disposed at back side focusing positions of the plurality of first microlenses, the second microlenses focusing real images of the pixel portions respectively on a surface that is to be exposed,
   wherein the real images of the pixel portions, which are focused by the second microlenses, serve as beam spots for exposing the surface that is to be exposed.

14. The exposure head of claim 13, further comprising a second optical system for focusing a real image group, which includes a collection of real images focused by the second microlenses, on the surface that is to be exposed.

15. The exposure head of claim 13, wherein the spatial modulation element comprises a micromirror device, and the pixel portions include micromirrors.

16. The exposure head of claim 13, wherein the pixel portions of the spatial modulation element modulate the laser beams from the laser emission portions into either of an exposing state and a non-exposing state.

17. The exposure head of claim 13, further comprising apertures disposed at vicinities of the back side focusing positions of the second microlenses, the apertures including opening diameters and opening shapes which correspond to spot diameters and spot shapes of the beam spots at the surface that is to be exposed.

18. An exposure apparatus comprising the exposure head of claim 13.

19. The exposure apparatus of claim 18, wherein the exposure head is supported such that a direction of arrangement of the pixel portions is inclined with respect to a direction of scanning of the surface that is to be exposed.

20. The exposure apparatus of claim 18, further comprising a movement apparatus which relatively moves the exposure head in a direction of scanning at a time of exposure of the surface that is to be exposed.

21. An exposure head comprising:
a light source unit including a laser beam;
a spatial modulation element for modulating the laser beam, including a plurality of pixel portions which change light modulation states in accordance with respective control signals, the pixel portions being arranged in a two-dimensional pattern on a predetermined support;
a first optical system for focusing images of the pixel portions of the spatial modulation element; and
a plurality of first microlenses arranged in a two-dimensional pattern so as to correspond to the pixel portions, the first microlenses being respectively supported at respective focusing positions of the pixel portions,
wherein light source images of the laser emission portions, which are formed at back side focusing positions of the first microlenses, are projected to a surface that is to be exposed, and the light source images serve as beam spots for exposing the surface that is to be exposed.

22. An exposure head comprising:
a light source unit including a laser beam;
a spatial modulation element for modulating the laser beam, including a plurality of pixel portions which change light modulation states in accordance with respective control signals, the pixel portions being arranged in a two-dimensional pattern on a predetermined support;
a first optical system for focusing images of the pixel portions of the spatial modulation element;
a plurality of first microlenses for focusing the laser beam, the first microlenses being two-dimensionally arranged at focusing positions of the plurality of pixel portions, at a pitch which is substantially the same as a size of images that are formed at the focusing positions; and
a plurality of second microlenses disposed at back side focusing positions of the plurality of first microlenses, the second microlenses focusing real images of the pixel portions respectively on a surface that is to be exposed,
wherein the real images of the pixel portions, which are focused by the second microlenses, serve as beam spots for exposing the surface that is to be exposed.

* * * * *